(12) United States Patent
Kim et al.

(10) Patent No.: US 12,550,324 B2
(45) Date of Patent: Feb. 10, 2026

(54) THREE-DIMENSIONAL SEMICONDUCTOR MEMORY DEVICE AND ELECTRONIC SYSTEM INCLUDING THE SAME

(71) Applicant: Samsung Electronics Co., Ltd., Suwon-si (KR)

(72) Inventors: Jaeho Kim, Hwaseong-si (KR); Jiwon Kim, Hwaseong-si (KR); Joonsung Kim, Seoul (KR); Sukkang Sung, Seongnam-si (KR); Sangdon Lee, Hwaseong-si (KR); Jong-Min Lee, Yongin-si (KR); Euntaek Jung, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 588 days.

(21) Appl. No.: 17/570,874

(22) Filed: Jan. 7, 2022

(65) Prior Publication Data
US 2023/0012115 A1    Jan. 12, 2023

(30) Foreign Application Priority Data
Jul. 7, 2021    (KR) ........................ 10-2021-0089311

(51) Int. Cl.
*H10B 43/27*  (2023.01)
*H10B 41/27*  (2023.01)
*H10B 41/41*  (2023.01)
*H10B 43/40*  (2023.01)

(52) U.S. Cl.
CPC ............. *H10B 43/27* (2023.02); *H10B 41/27* (2023.02); *H10B 41/41* (2023.02); *H10B 43/40* (2023.02)

(58) Field of Classification Search
CPC ........ H10B 43/27; H10B 43/40; H10B 41/27; H10B 41/41; H10B 43/10; H10B 41/10;
(Continued)

(56) References Cited

U.S. PATENT DOCUMENTS

| 8,953,376 B2 | 2/2015 | Nam et al. |
| 9,236,340 B2 | 1/2016 | Lee et al. |

(Continued)

FOREIGN PATENT DOCUMENTS

| CN | 112585753 A | 3/2021 |
| JP | 2020/126888 A | 8/2020 |

*Primary Examiner* — Jacob Y Choi
*Assistant Examiner* — Ashley Nicole Blackwell
(74) *Attorney, Agent, or Firm* — Harness, Dickey & Pierce, P.L.C.

(57) ABSTRACT

A three-dimensional semiconductor devices including a substrate, a stack structure including gate electrodes on the substrate and string selection electrodes spaced apart from each other on the gate electrodes, a first separation structure running in a first direction across the stack structure and being between the string selection electrodes, vertical channel structures penetrating the stack structure, and bit lines connected to the vertical channel structures and extending in a second direction may be provided. A first subset of the vertical channel structures is connected in common to one of the bit lines. The vertical channel structures of the first subset may be adjacent to each other in the second direction across the first separation structure. Each of the string selection electrodes may surround each of the vertical channel structures of the first subset.

18 Claims, 22 Drawing Sheets

(58) Field of Classification Search
CPC ........ H10B 41/20; H10B 41/50; H10B 43/50;
H10B 43/35; H10B 41/35; H10B 41/40;
H10B 43/20; H10B 53/10; H01L
23/5226; H01L 23/528; H01L 21/76816;
H01L 21/76877; H01L 29/167; H01L
29/41741; H01L 29/4234; H01L
29/42392; H01L 29/6681; H01L
29/78642; H10H 20/8581; H10H 20/819;
H10H 20/84; H10H 20/851; H10H
20/034; H10H 20/0361; H10H 20/0365;
H10H 20/8582; H10H 20/8514
See application file for complete search history.

(56) References Cited

U.S. PATENT DOCUMENTS

| | | | |
|---|---|---|---|
| 9,865,615 B2 | 1/2018 | Lee | |
| 10,020,319 B2 | 7/2018 | Baba | |
| 10,373,972 B2 | 8/2019 | Park et al. | |
| 10,636,814 B2 | 4/2020 | Barbato | |
| 10,833,096 B2 | 11/2020 | Tanaka et al. | |
| 10,937,803 B2 | 3/2021 | Kashima et al. | |
| 2016/0005759 A1* | 1/2016 | Kim | H10B 41/50 |
| | | | 257/314 |
| 2016/0013204 A1* | 1/2016 | Sakui | H10B 43/10 |
| | | | 438/269 |
| 2017/0047343 A1* | 2/2017 | Lee | H10B 43/40 |
| 2017/0084624 A1* | 3/2017 | Lee | H10B 41/35 |
| 2017/0200733 A1* | 7/2017 | Lee | H01L 23/528 |
| 2017/0287928 A1* | 10/2017 | Kanamori | H01L 23/528 |
| 2019/0043881 A1* | 2/2019 | Kim | H10D 30/6735 |
| 2019/0237477 A1* | 8/2019 | Baek | H10B 43/40 |
| 2021/0057444 A1* | 2/2021 | Park | H10B 43/27 |
| 2021/0091044 A1 | 3/2021 | Yamashita et al. | |
| 2021/0091110 A1 | 3/2021 | Liu et al. | |
| 2022/0068955 A1* | 3/2022 | King | H10B 43/27 |

* cited by examiner

THREE-DIMENSIONAL SEMICONDUCTOR MEMORY DEVICE AND ELECTRONIC SYSTEM INCLUDING THE SAME

CROSS-REFERENCE TO RELATED APPLICATION

This U.S. nonprovisional application claims priority under 35 U.S.C § 119 to Korean Patent Application No. 10-2021-0089311 filed on Jul. 7, 2021 in the Korean Intellectual Property Office, the disclosure of which is hereby incorporated by reference in its entirety.

BACKGROUND

Some example embodiments of the present inventive concepts relate to three-dimensional semiconductor memory devices, methods of fabricating the same, and/or electronic systems including the same, and more particularly to nonvolatile three-dimensional semiconductor memory devices including a vertical channel structure, methods of fabricating the same, and/or electronic systems including the same.

It is necessary to have a semiconductor device capable of storing a large amount of data in an electronic system which requires data storage. Semiconductor devices have been highly integrated to meet high performance and low manufacturing cost as required by customers. Integration of typical two-dimensional or planar semiconductor devices is primarily determined by the area occupied by a unit memory cell, and thus it is greatly influenced by the level of technology for forming fine patterns. However, the extremely expensive processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some example embodiments of the present inventive concepts provide three-dimensional semiconductor memory devices with improved reliability and electrical characteristics.

Some example embodiments of the present inventive concepts provide electronic systems including the three-dimensional semiconductor memory device.

Objects of the present inventive concepts are not limited to those example embodiments mentioned above, and other objects which have not been mentioned above will be clearly understood by those skilled in the art from the following description.

According to some example embodiments of the present inventive concepts, a three-dimensional semiconductor memory device may include a substrate, a stack structure including a plurality of gate electrodes stacked in a vertical direction on the substrate and a plurality of string selection electrodes spaced apart from each other in a horizontal direction on the gate electrodes, a first separation structure running in a first direction across the stack structure and being between the string selection electrodes, a plurality of vertical channel structures penetrating the stack structure, and a plurality of bit lines having connection with the vertical channel structures and extending in a second direction intersecting the first direction. A first subset of the vertical channel structures may be connected in common to one of the bit lines. The vertical channel structures of the first subset may be adjacent to each other in the second direction across the first separation structure. Each of the string selection electrodes may surround each of the vertical channel structures of the first subset.

According to some example embodiments of the present inventive concepts, a three-dimensional semiconductor memory device may include a substrate, a stack structure including a plurality of gate electrodes stacked in a vertical direction on the substrate and a plurality of string selection electrodes spaced apart from each other in a horizontal direction on the gate electrodes, a source structure between the substrate and the stack structure, a first separation structure between the string selection electrodes and being in a first trench that runs in a first direction across the stack structure, a second separation structure in a second trench on a lateral surface of the stack structure, the second separation structure extending the first direction, a plurality of vertical channel structures in a plurality of vertical channel holes that penetrate the stack structure, the vertical channel structures being arranged in a zigzag fashion along a second direction intersecting the first direction, a plurality of bit lines connected to the vertical channel structures, the bit lines extending in the second direction, a plurality of bit-line contact plugs connecting the bit lines to corresponding ones of the vertical channel structures, respectively, a dielectric layer covering the stack structure, and a plurality of cell contact plugs penetrating the dielectric layer and at least a portion of the stack structure and connected to either the gate electrodes or the string selection electrodes. A subset of the vertical channel structures may be connected in common to one of the bit lines. The vertical channel structures of the subset may be adjacent in the second direction to each other across the first separation structure. Each of the vertical channel structures may overlap in the vertical direction with two of the bit lines.

According to some example embodiments of the present inventive concepts, an electronic system may include a three-dimensional semiconductor memory device including a first substrate, a peripheral circuit structure on the first substrate, a cell array structure on the peripheral circuit structure, a dielectric layer that covers the cell array structure, and an input/output pad on the dielectric layer and electrically connected to the peripheral circuit structure, and a controller configured to have electrical connection through the input/output pad with the three-dimensional semiconductor memory device and to control the three-dimensional semiconductor memory device. The cell array structure may include a second substrate on the peripheral circuit structure, a stack structure including a plurality of gate electrodes stacked in a vertical direction on the second substrate and a plurality of string selection electrodes spaced apart from each other in a horizontal direction on the gate electrodes, a first separation structure running in a first direction across the stack structure and being between the string selection electrodes, a plurality of vertical channel structures penetrating the stack structure, and a plurality of bit lines connected to the vertical channel structures and extending in a second direction intersecting the first direction. A first subset of the vertical channel structures may be connected in common to one of the bit lines. The vertical channel structures of the first subset may be adjacent in the second direction to each other across the first separation structure. Each of the string selection electrodes may surround each of the vertical channel structures of the first subset.

DETAILED DESCRIPTION

The following will now describe in detail a three-dimensional semiconductor memory device, a method of fabricating the same, and an electronic system including the same according to some embodiments of the present inventive concepts in conjunction with the accompanying drawings.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
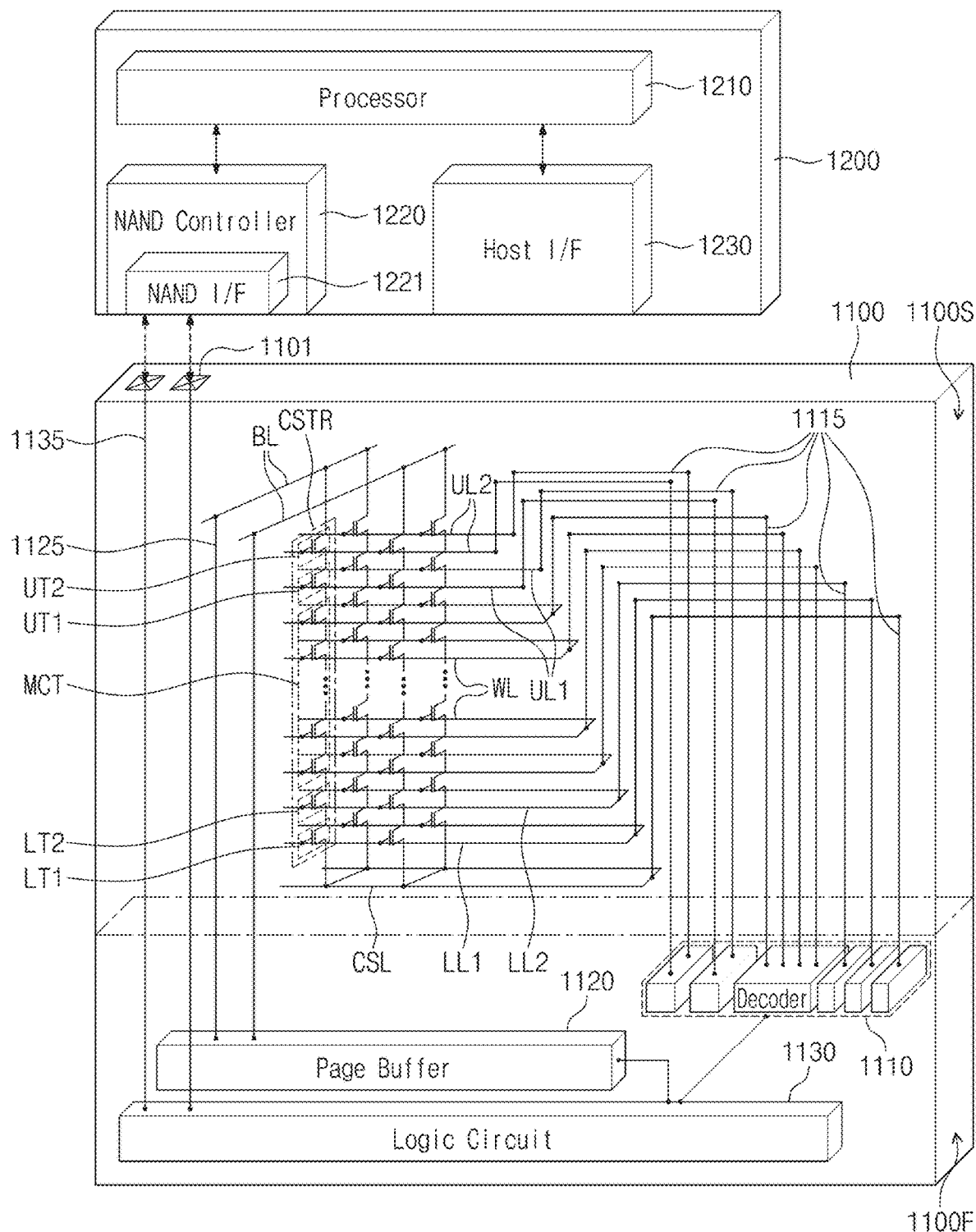
FIG. 1 illustrates a simplified block diagram showing an electronic system that includes a three-dimensional semiconductor memory device according to some example embodiments of the present inventive concepts.

FIG. 1 illustrates a simplified block diagram showing an electronic system that includes a three-dimensional semiconductor memory device according to some example embodiments of the present inventive concepts.

Referring to FIG. 1, an electronic system 1000 according to some example embodiments of the present inventive concepts may include a three-dimensional semiconductor memory device 1100 and a controller 1200 electrically connected to the three-dimensional semiconductor memory device 1100. The electronic system 1000 may be a storage device that includes a single or a plurality of three-dimensional semiconductor memory devices 1100 or may be an electronic device that includes the storage device. For example, the electronic system 1000 may be a solid state drive (SSD) device, a universal serial bus (USB), a computing system, a medical apparatus, or a communication apparatus each of which includes a single or a plurality of three-dimensional semiconductor memory devices 1100.

The three-dimensional semiconductor memory device 1100 may be a nonvolatile memory device, such as a three-dimensional NAND Flash memory device which will be discussed below. The three-dimensional semiconductor memory device 1100 may include a first region 1100F and a second region 1100S on the first region 1100F. For example, the first region 1100F may be disposed on a side of the second region 1100S. The first region 1100F may be a peripheral circuit region that includes a decoder circuit 1110, a page buffer 1120, and a logic circuit 1130. The second region 1100S may be a memory cell region that includes bit lines BL, a common source line CSL, word lines WL, first lines LL1 and LL2, second lines UL1 and UL2, and memory cell strings CSTR between the bit line BL and the common source line CSL.

On the second region 1100S, each of the memory cell strings CSTR may include first transistors LT1 and LT2 adjacent to the common source line CSL, second transistors UT1 and UT2 adjacent to the bit line BL, and memory cell transistors MCT disposed between the first transistors LT1 and LT2 and the second transistors UT1 and UT2. The number of the first transistors LT1 and LT2 and of the second transistors UT1 and UT2 may be variously changed in accordance with example embodiments.

For example, the first transistors LT1 and LT2 may include a ground selection transistor, and the second transistors UT1 and UT2 may include a string selection transistor. The first lines LL1 and LL2 may be gate electrodes of the first transistors LT1 and LT2, respectively. The word lines WL may be gate electrodes of the memory cell transistors MCT. The second lines UL1 and UL2 may be gate electrodes of the second transistors UT1 and UT2, respectively.

For example, the first transistors LT1 and LT2 may include a first erasure control transistor LT1 and a ground selection transistor LT2 that are connected in series. The second transistors UT1 and UT2 may include a string selection transistor UT1 and a second erase control transistor UT2 that are connected in series. One or both of the first and second erasure control transistors LT1 and UT2 may be employed to perform an erase operation in which a gate induced drain leakage (GIDL) phenomenon is used to erase data stored in the memory cell transistors MCT.

The common source line CSL, the first lines LL1 and LL2, the word lines WL, and the second lines UL1 and UL2 may be electrically connected to the decoder circuit 1110 through first connection lines 1115 that extend from the first region 1100F toward the second region 1100S. The bit lines BL may be electrically connected to the page buffer 1120 through second connection lines 1125 that extend from the first region 1100F toward the second region 1100S.

On the first region 1100F, the decoder circuit 1110 and the page buffer 1120 may perform a control operation to at least one select memory cell transistor among the plurality of memory cell transistors MCT. The logic circuit 1130 may control the decoder circuit 1110 and the page buffer 1120. The three-dimensional semiconductor memory device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first region 1100F toward the second region 1100S.

The controller 1200 may include a processor 1210, a NAND controller 1220, and a host interface 1230. For example, the electronic system 1000 may include a plurality of three-dimensional semiconductor memory devices 1100, and in this case, the controller 1200 may control the plurality of three-dimensional semiconductor memory devices 1100.

The processor 1210 may control an overall operation of the electronic system 1000 that includes the controller 1200. The processor 1210 may operate based on certain firmware, and may control the NAND controller 1220 to access the three-dimensional semiconductor memory device 1100. The NAND controller 1220 may include NAND interface 1221 that processes communication with the three-dimensional semiconductor memory device 1100. The NAND interface 1221 may be used to transfer therethrough a control command which is intended to control the three-dimensional semiconductor memory device 1100, data which is intended to be written on the memory cell transistors MCT of the three-dimensional semiconductor memory device 1100, and/ or data which is intended to be read from the memory cell transistors MCT of the three-dimensional semiconductor memory device 1100. The host interface 1230 may provide the electronic system 1000 with communication with an external host. When a control command is received through the host interface 1230 from an external host, the three-dimensional semiconductor memory device 1100 may be controlled by the processor 1210 in response to the control command.

Figure 2:
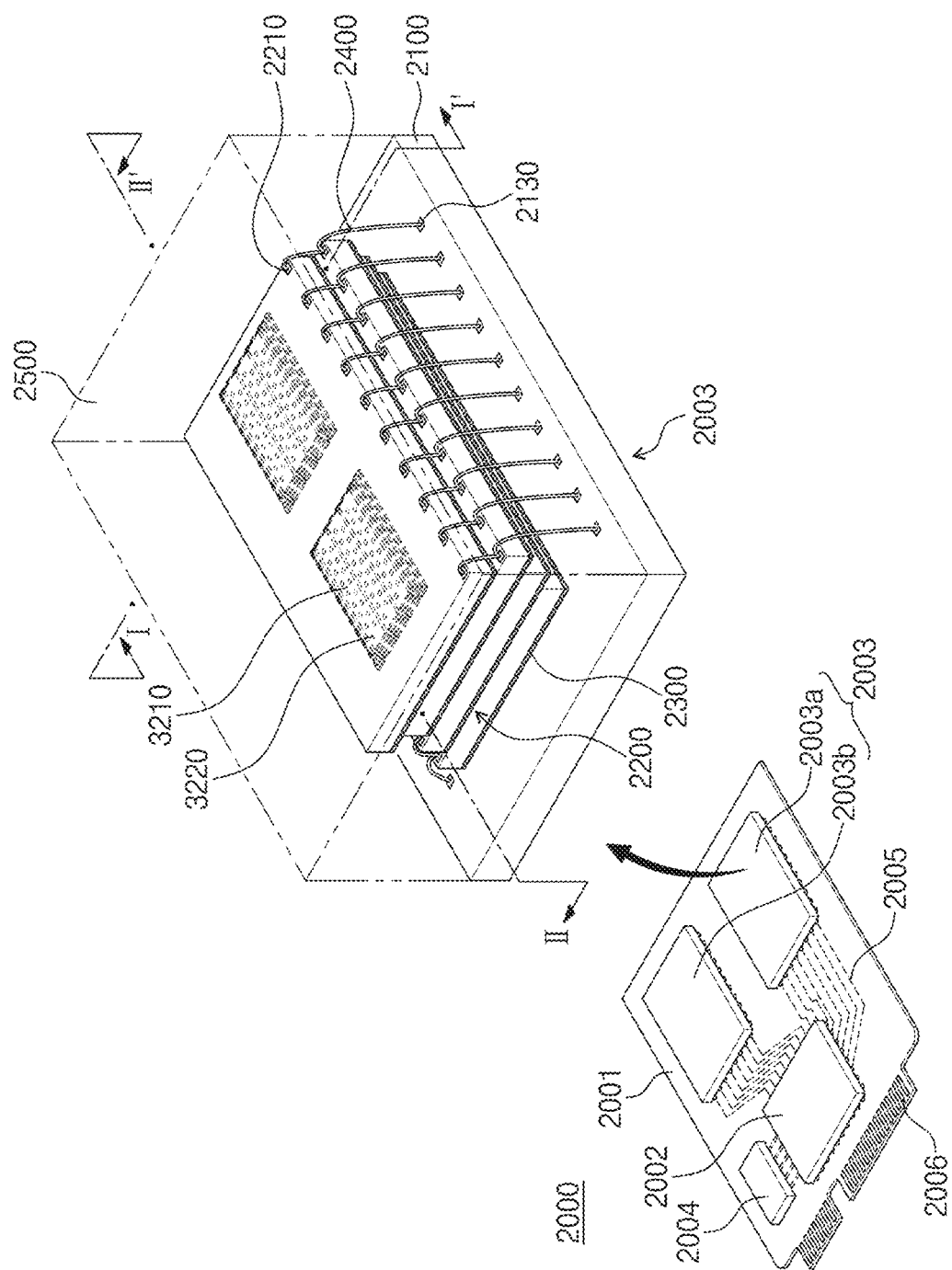
FIG. 2 illustrates a simplified perspective view showing an electronic system that includes a three-dimensional semiconductor memory device according to some example embodiments of the present inventive concepts.

FIG. 2 illustrates a simplified perspective view showing an electronic system that includes a three-dimensional semiconductor memory device according to some example embodiments of the present inventive concepts.

Referring to FIG. 2, an electronic system 2000 according to some embodiments of the present inventive concepts may include a main board 2001, a controller 2002 mounted on the main board 2001, one or more semiconductor packages 2003, and a dynamic random access memory (DRAM) 2004. The semiconductor package 2003 and the DRAM 2004 may be connected to the controller 2002 through wiring patterns 2005 provided in the main board 2001.

The main board 2001 may include a connector 2006 including a plurality of pins that are provided to have connection with an external host. The number and arrangement of the plurality of pins on the connector 2006 may be changed based on a communication interface between the electronic system 2000 and the external host. The electronic system 2000 may communicate with the external host through one or more interfaces, for example, universal serial bus (USB), peripheral component interconnect express (PCI-Express), serial advanced technology attachment (SATA), and/or M-PHY for universal flash storage (UFS). For example, the electronic system 2000 may operate with power that is supplied through the connector 2006 from an external host. The electronic system 2000 may further include a power management integrated circuit (PMIC) by which the power supplied from the external host is distributed to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between an external host and the semiconductor package 2003 that serves as a data storage space. The DRAM 2004 included in the electronic system 2000 may operate as a kind of cache memory, and may provide a space for temporary data storage in a control operation of the semiconductor package 2003. When the DRAM 2004 is included in the electronic system 2000, the controller 2002 may include not only a NAND controller for controlling the semiconductor package 2003, but a DRAM controller for controlling the DRAM 2004.

The semiconductor package 2003 may include first and second semiconductor packages 2003a and 2003b that are spaced apart from each other. Each of the first and second semiconductor packages 2003a and 2003b may include a plurality of semiconductor chips 2200. Each of the first and second semiconductor package 2003a and 2003b may include a package substrate 2100, semiconductor chips 2200 on the package substrate 2100, adhesion layers 2300 on bottom surfaces of the semiconductor chips 2200, connection structures 2400 that electrically connect the semiconductor chips 2200 to the package substrate 2100, and a molding layer 2500 that is provided on the package substrate 2100 and covers the semiconductor chips 2200 and the connection structures 2400.

The package substrate 2100 may be an integrated circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stack structures 3210 and vertical channel structures 3220. Each of the semiconductor chips 2200 may include a three-dimensional semiconductor memory device which will be discussed below.

For example, the connection structures 2400 may be bonding wires that electrically connect the input/output pads 2210 to the package upper pads 2130. On each of the first and second semiconductor packages 2003a and 2003b, the semiconductor chips 2200 may be electrically connected to each other in a wire bonding manner, and may be electrically connected to the package upper pads 2130 of the package substrate 2100. In some example embodiments, on each of the first and second semiconductor packages 2003a and 2003b, the semiconductor chips 2200 may be electrically connected to each other using through-silicon vias (TSVs) instead of the connection structures 2400 or the bonding wires.

For example, the controller 2002 and the semiconductor chips 2200 may be included in a single package. For example, the controller 2002 and the semiconductor chips 2200 may be mounted on a separate interposer substrate other than the main board 2001, and may be connected to each other through lines provided in the interposer substrate.

Figure 3:
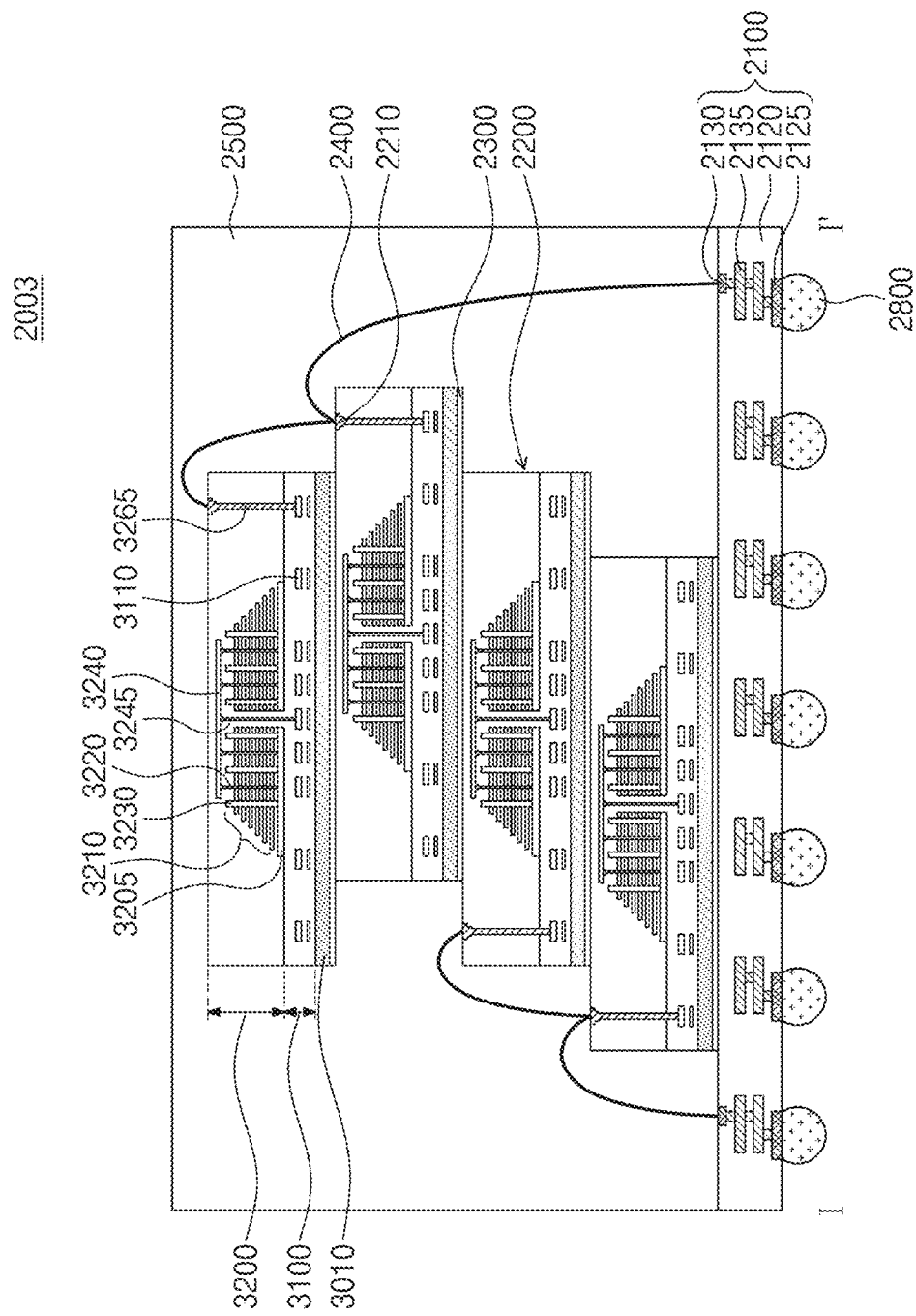
FIGS. 3 and 4 illustrate cross-sectional views respectively taken along lines I-I' and II-II' of FIG. 2, respectively, showing a semiconductor package that includes a three-dimensional semiconductor memory device according to some example embodiments of the present inventive concepts.
Figure 4:
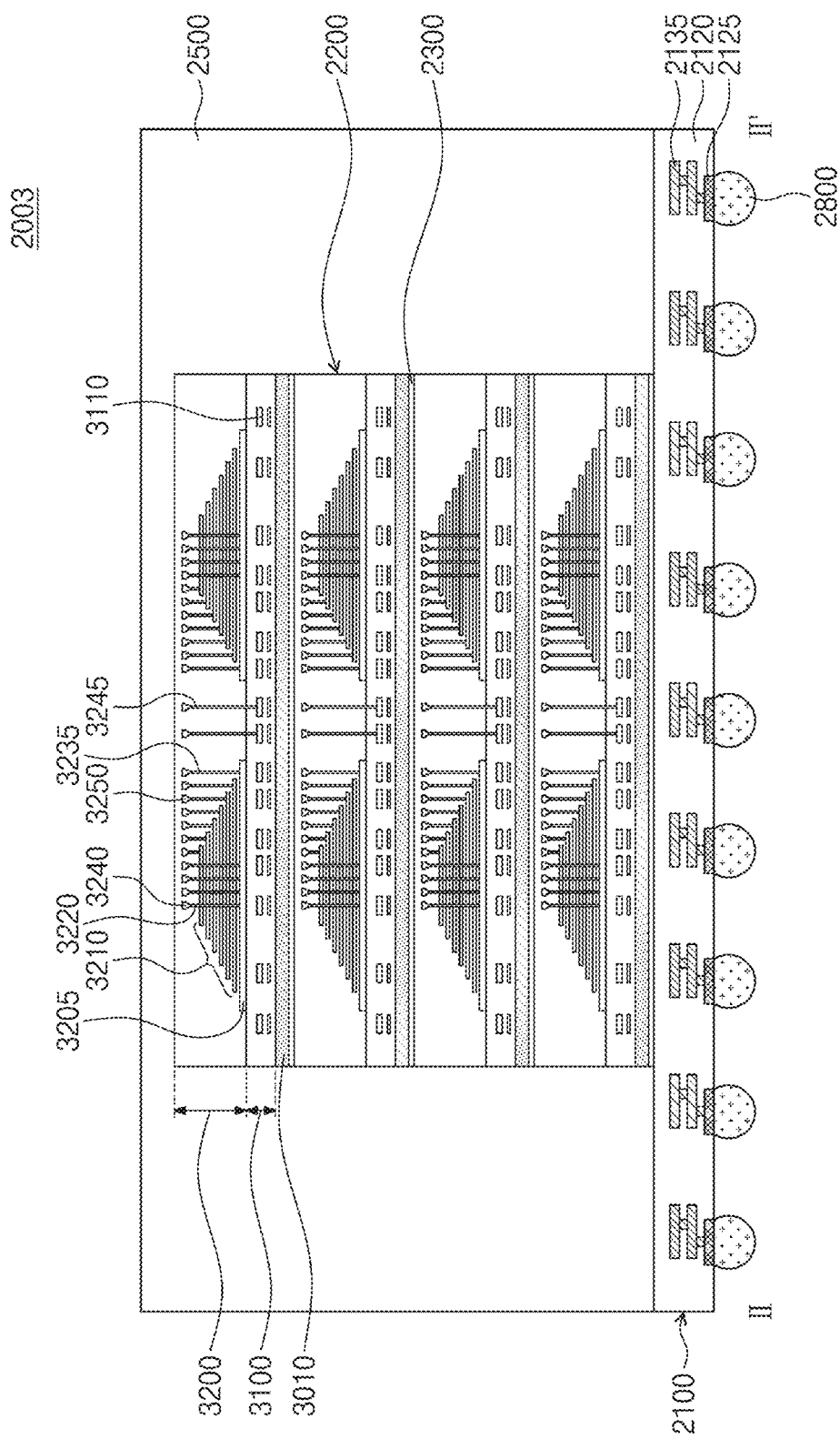

FIGS. 3 and 4 illustrate cross-sectional views taken along lines I-I' and II-II' of FIG. 2, respectively, showing a semiconductor package that includes a three-dimensional semiconductor memory device according to some example embodiments of the present inventive concepts.

Referring to FIGS. 3 and 4, a semiconductor package 2003 may include a package substrate 2100, a plurality of semiconductor chips on the package substrate 2100, and a molding layer 2500 that covers the package substrate 2100 and the plurality of semiconductor chips.

The package substrate 2100 may include a package substrate body 2120, package upper pads 2130 disposed on a top surface of the package substrate body 2120, package lower pads 2125 disposed or exposed on a bottom surface of the package substrate body 2120, and internal wiring lines 2135 that are provided in the package substrate body 2120 and electrically connect the package upper pads 2130 to the package lower pads 2125. The package upper pads 2130 may be electrically connected to connection structures 2400. The package lower pads 2125 may be connected through conductive connectors 2800 to the wiring patterns 2005 in the main board 2001 of the electronic system 2000 depicted in FIG. 2.

Each of the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral lines 3110. The second structure 3200 may include a common source line 3205, a gate stack structure 3210 on the common source line 3205, vertical channel structures 3220 and separation structure 3230 that penetrate the gate stack structure 3210, bit lines 3240 electrically connected to the vertical channel structures 3220, gate connection lines 3235 and conductive lines 3250 that are electrically connected to word lines (see WL of FIG. 1) of the gate stack structure 3210.

Each of the semiconductor chips 2200 may include one or more through lines 3245 that have electrical connection with the peripheral wiring lines 3110 of the first structure 3100 and extend into the second structure 3200. The through line 3245 may penetrate the gate stack structure 3210, or may further be disposed outside the gate stack structure 3210. Each of the semiconductor chips 2200 may further include an input/output connection line 3265 that has electrical connection with the peripheral line 3110 of the first structure 3100 and extends into the second structure 3200, and may also further include an input/output pad 2210 electrically connected to the input/output connection line 3265.

Figure 5:
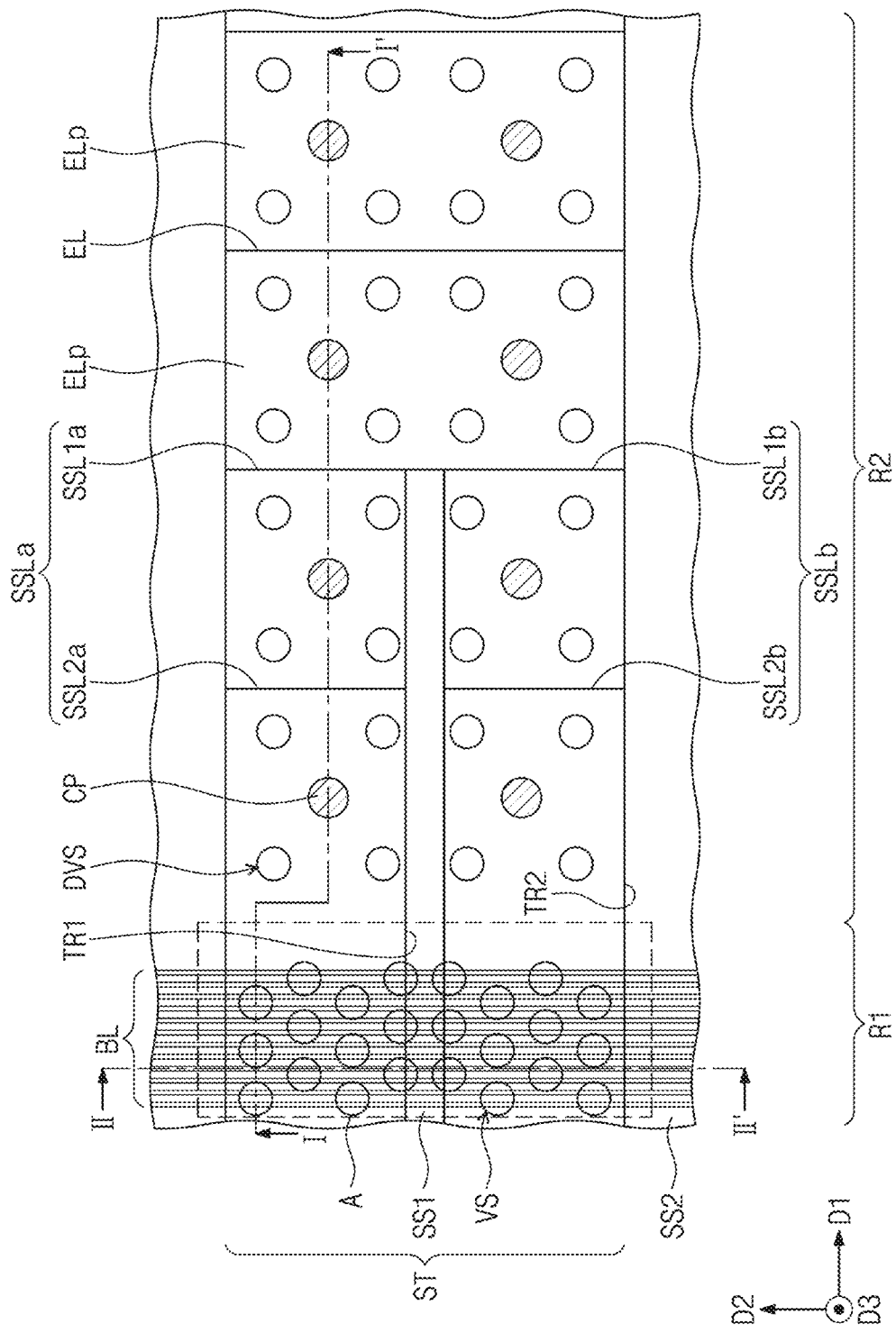
FIG. 5 illustrates a plan view showing a three-dimensional semiconductor memory device according to some example embodiments of the present inventive concepts.
Figure 6:
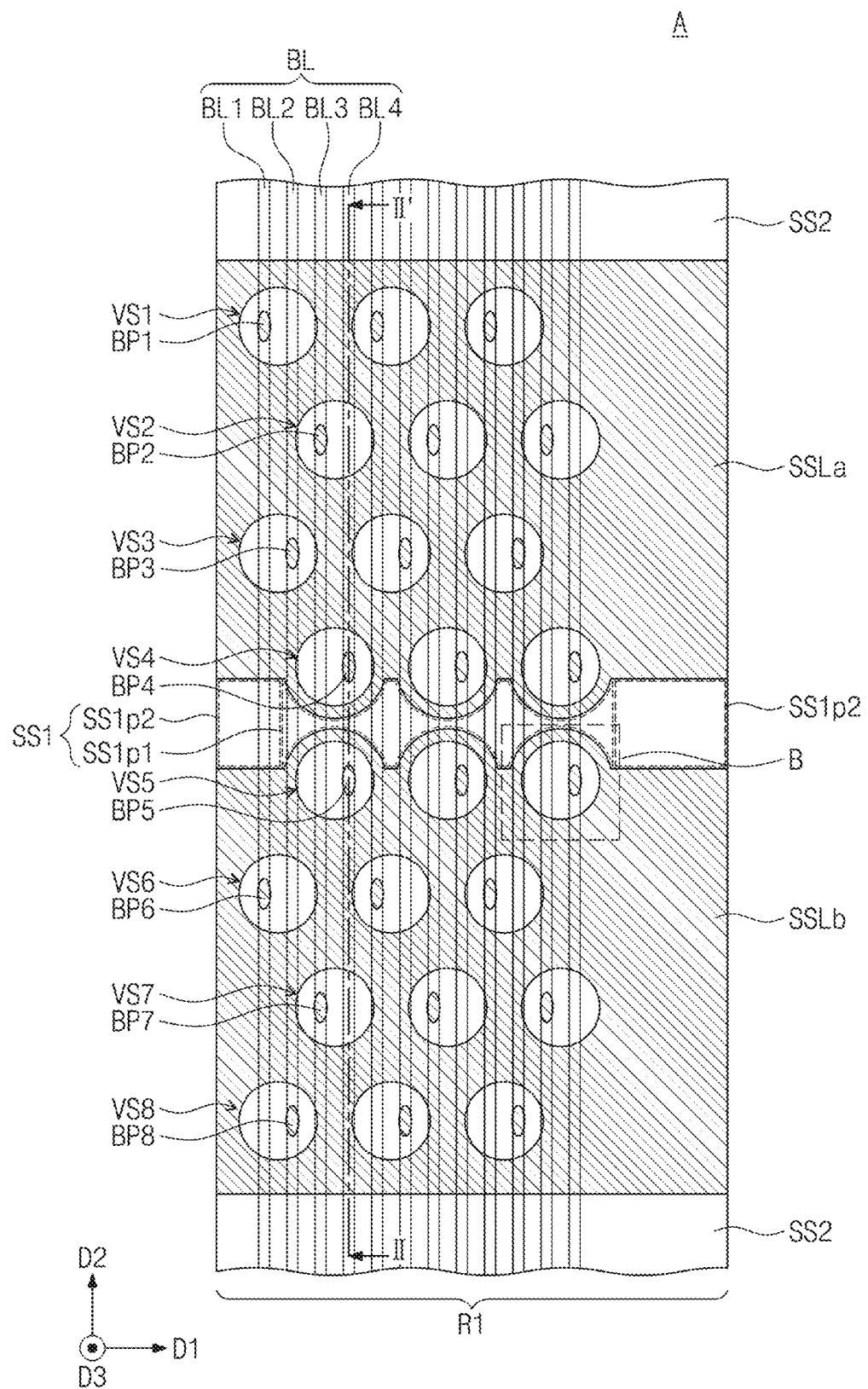
FIG. 6 illustrates a plan view showing section A of FIG. 5, showing a three-dimensional semiconductor memory device according to some example embodiments of the present inventive concepts.
Figure 7A:
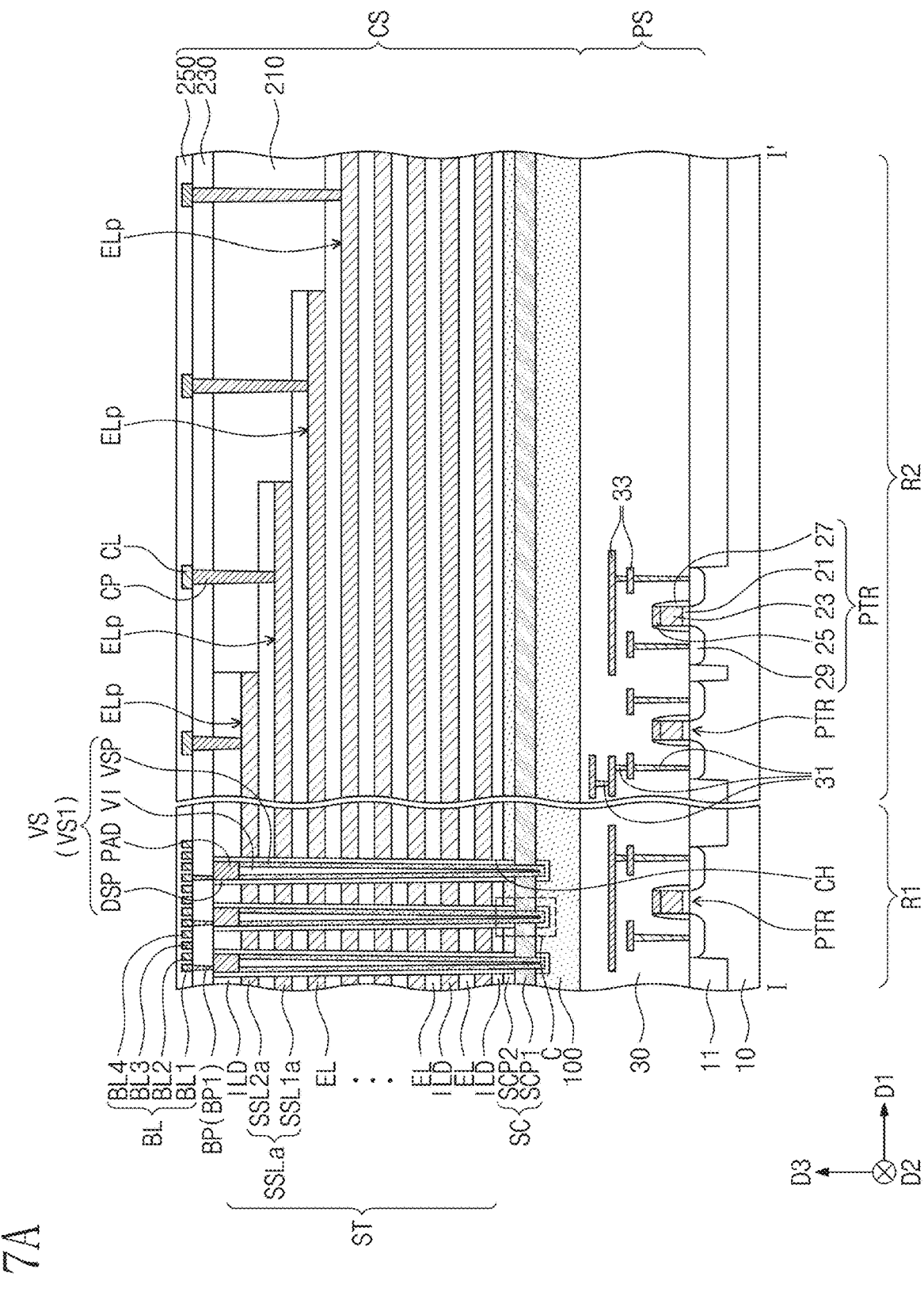
FIGS. 7A and 7B illustrate cross-sectional views respectively taken along lines I-I' and II-II' of FIG. 5, respectively, showing a three-dimensional semiconductor memory device according to some example embodiments of the present inventive concepts.
Figure 7B:
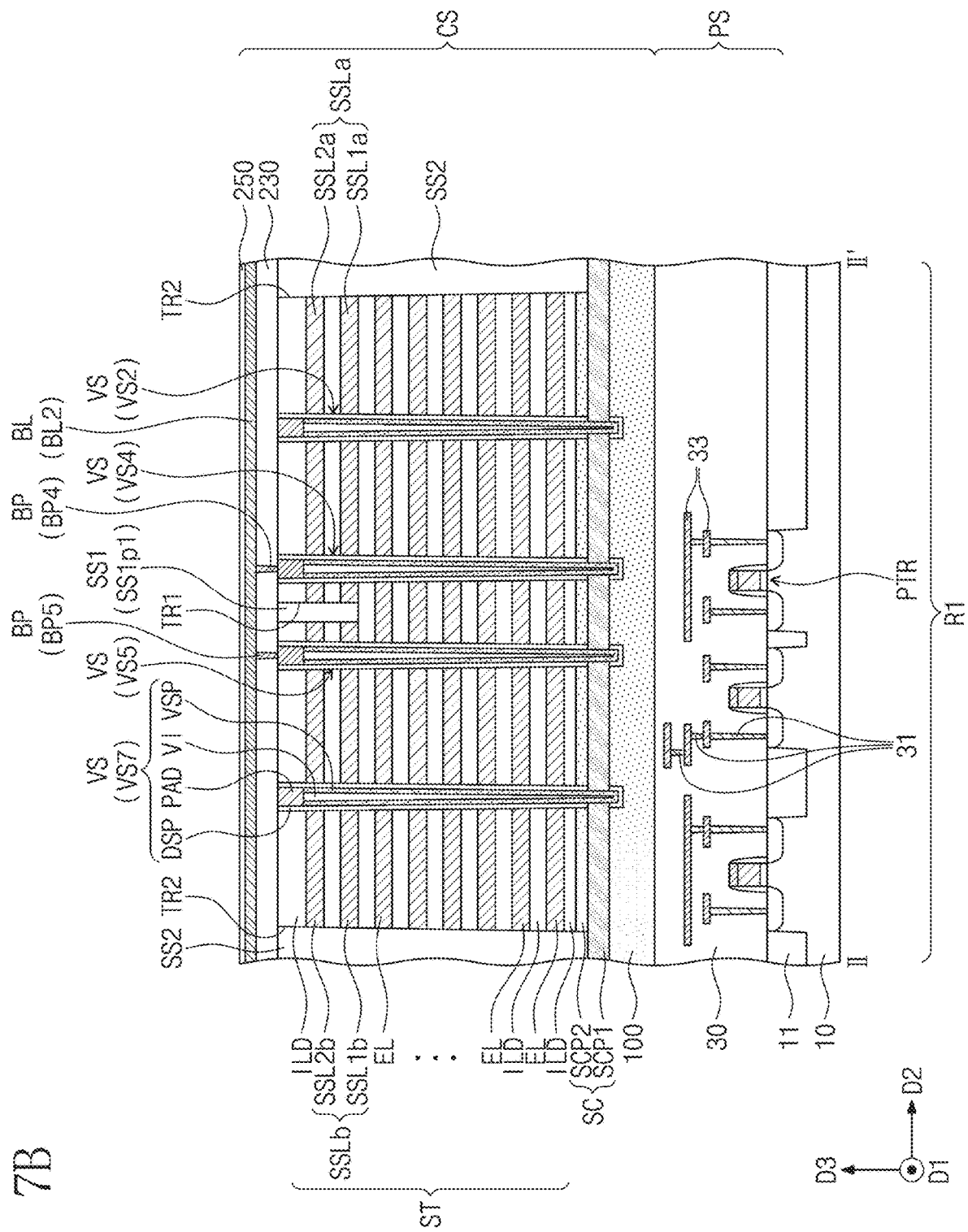

FIG. 5 illustrates a plan view showing a three-dimensional semiconductor memory device according to some example embodiments of the present inventive concepts. FIG. 6 illustrates a plan view showing section A of FIG. 5, showing a three-dimensional semiconductor memory device according to some example embodiments of the present inventive concepts. FIGS. 7A and 7B illustrate cross-sectional views taken along lines I-I' and II-II' of FIG. 5, respectively, showing a three-dimensional semiconductor memory device according to some example embodiments of the present inventive concepts.

Referring to FIGS. 5, 6, 7A, and 7B, a three-dimensional semiconductor memory device according to some example embodiments of the present inventive concepts may include a first substrate 10, a peripheral circuit structure PS on the first substrate 10, and a cell array structure CS on the peripheral circuit structure PS. The first substrate 10, the peripheral circuit structure PS, and the cell array structure CS may correspond to the semiconductor substrate 3010, the first structure 3100 on the semiconductor substrate 3010, and the second structure 3200 on the first structure 3100 of FIGS. 3 and 4, respectively.

The first substrate 10 may include a first region R1 and a second region R2. The second region R2 may extend in a first direction D1 from a one side of the first region R1. The first region R1 may be an area on which the vertical channel structures 3220, the separation structures 3230, and the bit lines 3240 electrically connected to the vertical channel structures 3220 are provided. Components 3220, 3230, and 3240 are discussed above with reference to FIGS. 3 and 4. The second region R2 may be an area on which a stepwise structure including pad parts ELp is provided. The stepwise structure including pad parts ELp will be discussed below.

The first substrate 10 may extend in the first direction D1 and a second direction D2 intersecting the first direction D1. The first substrate 10 may have a top surface perpendicular to a third direction D3 that intersects the first and second directions D1 and D2. For example, the first, second, and third directions D1, D2, and D3 may be orthogonal to each other.

The first substrate 10 may be, for example, a silicon substrate, a silicon-germanium substrate, a germanium substrate, or a single-crystalline epitaxial layer grown on a single-crystalline silicon substrate.

A device isolation layer 11 may be provided in the first substrate 10. The device isolation layer 11 may define an active section of the first substrate 10. The device isolation layer 11 may include, for example, silicon oxide.

The peripheral circuit structure PS may be provided on the first substrate 10. The peripheral circuit structure PS may include peripheral circuit transistors PTR on the active section of the first substrate 10, peripheral contact plugs 31, peripheral circuit lines 33 electrically connected through the peripheral contact plugs 31 to the peripheral circuit transistors PTR, and a first dielectric layer 30 that surround the peripheral circuit transistors PTR, the peripheral contact plugs 31, and the peripheral circuit lines 33. The peripheral circuit structure PS may correspond to the first region 1100F of FIG. 1, and the peripheral circuit lines 33 may correspond to the peripheral lines 3110 of FIGS. 3 and 4.

A peripheral circuit may be constituted by the peripheral circuit transistors PTR, the peripheral contact plugs 31, and the peripheral circuit lines 33. For example, the peripheral circuit transistors PTR may constitute the decoder circuit 1110, the page buffer 1120, and the logic circuit 1130 of FIG. 1. For example, each of the peripheral circuit transistors PTR may include a peripheral gate dielectric layer 21, a peripheral gate electrode 23, a peripheral capping pattern 25, a peripheral gate spacer 27, and peripheral source/drain regions 29.

The peripheral gate dielectric layer 21 may be provided between the peripheral gate electrode 23 and the first substrate 10. The peripheral capping pattern 25 may be provided on the peripheral gate electrode 23. The peripheral gate spacer 27 may cover a sidewall of the peripheral gate dielectric layer 21, a sidewall of the peripheral gate electrode 23, a sidewall and of the peripheral capping pattern 25. The peripheral source/drain regions 29 may be provided in the first substrate 10 adjacent to opposite sides of the peripheral gate electrode 23.

The peripheral circuit lines 33 may be electrically connected through the peripheral contact plugs 31 to the peripheral circuit transistors PTR. Each of the peripheral circuit transistors PTR may be, for example, an NMOS transistor, a PMOS transistor, or a gate-all-around type transistor. For example, the peripheral contact plugs 31 may have a width in the first direction D1 or the second direction D2, and the width may increase with increasing distance from the first substrate 10. The peripheral contact plugs 31 and the peripheral circuit lines 33 may include a conductive material, such as metal.

The first dielectric layer 30 may be disposed on the top surface of first substrate 10. On the first substrate 10, the first dielectric layer 30 may cover the peripheral circuit transistors PTR, the peripheral contact plugs 31, and the peripheral circuit lines 33. The first dielectric layer 30 may include a plurality of stacked dielectric layers. The first dielectric layer 30 may include a dielectric material, for example, one or more of silicon oxide, silicon nitride, silicon oxynitride, and low-k dielectrics.

The first dielectric layer 30 may be provided thereon with a second substrate 100 and a cell array structure CS that includes a stack structure ST on the second substrate 100. The second substrate 100 may extend in the first and second directions D1 and D2. The second substrate 100 may be a semiconductor substrate including a semiconductor material. The second substrate 100 may include, for example, silicon (Si), germanium (Ge), silicon germanium (SiGe), gallium arsenic (GaAs), indium gallium arsenic (InGaAs), aluminum gallium arsenic (AlGaAs), or a mixture thereof.

The stack structure ST may be provided on the second substrate 100. The stack structure ST may extend from the first region R1 toward the second region R2. The stack structure ST may correspond to the gate stack structure 3210 of FIGS. 3 and 4. The stack structure ST may be provided in plural, and the plurality of stack structures ST may be arranged along the second direction D2 and may be spaced apart in the second direction D2 from each other across a second separation structure SS2 which will be discussed below. For convenience of description, the following explanation will focus on a single stack structure ST, but this explanation may also be applicable to other stack structures ST.

The stack structure ST may include gate electrodes EL stacked on the second substrate 100, first and second string selection electrodes SSLa and SSLb that are spaced apart from each other in the second direction D2 on the gate electrodes EL, and interlayer dielectric layers ILD interposed between the gate electrodes EL and between the gate electrodes EL and the first and second string selection electrodes SSLa and SSLb. The gate electrodes EL may correspond to the first lines LL1 and LL2 of FIG. 1 and the word lines WL of FIG. 1, respectively. The first and second string selection electrodes SSLa and SSLb may correspond to the second lines UL1 and UL2 of FIG. 1, respectively. Each of the gate electrodes EL may have a thickness in the third direction D3 that is substantially the same as a thickness in the third direction D3 of each of the first and second string selection electrodes SSLa and SSLb, but the present inventive concepts are limited thereto. In this description below, the term "thickness" may indicate a thickness in the third direction D3.

The gate electrodes EL may have their lengths in the first direction D1 that decrease with increasing distance from the second substrate 100 (e.g., decrease in the third direction D3). For example, the length in the first direction D1 of one gate electrode EL may be greater than the length in the first direction D1 of a next gate electrode EL directly above the one gate electrode EL. A lowermost one of the gate electrodes EL may have the largest length in the first direction D1, and an uppermost one of the gate electrodes EL may have the smallest length in the first direction D1.

The gate electrodes EL and the first and second string selection electrodes SSLa and SSLb may their pad parts ELp, respectively, on the second region R2. The pad part ELp may be horizontally and vertically located at different positions. The pad parts ELp may constitute a stepwise structure along the first direction D1.

The stepwise structure may cause the stack structure ST to have a thickness that decreases with increasing distance from an outermost one of vertical channel structures VS which will be discussed, and the gate electrodes EL may have their sidewalls that are equally spaced apart from each other along the first direction D1 when viewed in a plan view.

The first string selection electrode SSLa may include a first lower string selection electrode SSL1a on the uppermost gate electrode EL and a first upper string selection electrode SSL2a on the first lower string selection electrode SSL1a. The second string selection electrode SSLb may include a second lower string selection electrode SSL1b on the uppermost gate electrode EL and a second upper string selection electrode SSL2b on the second lower string selection electrode SSL1b. The first lower string selection electrode SSL1a and the second lower string selection electrode SSL1b may be located at the same level, and may be spaced apart in the second direction D2 from each other across a first separation structure SS1 which will be discussed below. The first upper string selection electrode SSL2a and the second upper string selection electrode SSL2b may be located at the same level, and may be spaced apart in the second direction D2 from the first separation structure SS1. For example, the first string selection electrode SSLa and the second string selection electrode SSLb may be spaced apart in the second direction D2 from each other across the first separation structure SS1.

The gate electrodes EL and the first and second string selection electrodes SSLa and SSLb may include, for example, one or more of doped semiconductor (e.g., doped silicon), metal (e.g., tungsten, copper, and/or aluminum), conductive metal nitride (e.g., titanium nitride and/or tantalum nitride), and transition metal (e.g., titanium and/or tantalum). The gate electrodes EL and the first and second string selection electrodes SSLa and SSLb may include, for example, tungsten.

The interlayer dielectric layers ILD may each have a sidewall aligned with that of one of the gate electrodes EL and the first and second string selection electrodes SSLa and SSLb. One of the electrodes EL, SSLa, and SSLb may be upwardly coupled to the interlayer dielectric layer ILD. For example, likewise the gate electrodes EL, the interlayer dielectric layers ILD may have their lengths in the first direction D1 that decrease with increasing distance from the second substrate 100.

Each of the interlayer dielectric layers ILD may have a thickness less than that of each of the gate electrodes EL. For example, a lowermost one of the interlayer dielectric layers ILD may have a thickness less than that of each of other interlayer dielectric layers ILD. For example, an uppermost one of the interlayer dielectric layers ILD may have a thickness greater than that of each of other interlayer dielectric layers ILD. Except the lowermost and uppermost ones of the interlayer dielectric layers ILD, the others of the interlayer dielectric layers ILD may have substantially the same thickness. However, this is merely an example, and the interlayer dielectric layers ILD may have their thicknesses that are changed depending on properties of a semiconductor device.

The interlayer dielectric layers ILD may include, for example, one or more of silicon oxide, silicon nitride, silicon oxynitride, and low-k dielectrics. For example, the interlayer dielectric layers ILD may include high density plasma (HDP) oxide or tetraethylorthosilicate (TEOS).

A source structure SC may be provided between the second substrate 100 and the lowermost one of the interlayer dielectric layers ILD. The source structure SC may correspond to the common source line CSL of FIG. 1 or the common source line 3205 of FIGS. 3 and 4. The source structure SC may include a first source conductive pattern SCP1 and a second source conductive pattern SCP2 that are sequentially stacked on the second substrate 100. The second source conductive pattern SCP2 may be provided between the first source conductive pattern SCP1 and the lowermost one of the interlayer dielectric layers ILD. The first source conductive pattern SCP1 may have a thickness greater than that of the second source conductive pattern SCP2. The first and second source conductive patterns SCP1 and SCP2 may include an impurity-doped semiconductor material. For example, the first source conductive pattern SCP1 may have an impurity concentration greater than that of the second source conductive pattern SCP2.

On the first region R1, a plurality of vertical channel structures VS may be provided in a plurality of vertical channel holes CH that penetrate the stack structure ST and the source structure SC. The vertical channel structures VS may penetrate at least a portion of the second substrate 100, and each of the vertical channel structures VS may have a bottom surface located at a lower level than that of the top surface of the second substrate 100 and that of a bottom surface of the source structure SC. For example, the vertical channel structures VS may be in direct contact with the second substrate 100.

When viewed in a plan view, the vertical channel structures VS may be arranged in a zigzag fashion along the first direction D1 or the second direction D2. The vertical channel structures VS may not be provided on the second region R2. The vertical channel structures VS may have their widths in the first direction D1 or the second direction D2 that increase in the third direction D3. The vertical channel structures VS may correspond to the vertical channel structures 3220 of FIGS. 2 to 4. The vertical channel structures VS may correspond to channels of the first transistors LT1 and LT2, channels of the memory cell transistors MCT, and channels of the second transistors UT1 and UT2. Transistors LT1, LT2, MCT, UT1, and UT2 are depicted in FIG. 1.

For example, each of the vertical channel structures VS may include at least one part whose width is discontinuously changed in the first direction D1 or the second direction D2. However, this is merely an example, and the present inventive concepts are not limited thereto. For example, each of the vertical channel structures VS may not include a part whose width is discontinuously changed, and in this case may have a flat sidewall.

Each of the vertical channel structures VS may include a data storage pattern DSP and a vertical semiconductor pattern VSP that are sequentially provided on an inner sidewall of the vertical channel holes CH, a buried dielectric pattern VI that fills an inner space surrounded by the vertical semiconductor pattern VSP, and a conductive pad PAD on the buried dielectric pattern VI. The conductive pad PAD may be provided in a space surrounded by the buried dielectric pattern VI and the data storage pattern DSP. In other example embodiments, the conductive pad PAD may be provided in a space surrounded by the buried dielectric pattern VI and the vertical semiconductor pattern VSP. The vertical channel structures VS may each have a top surface that has, for example, a circular shape, an oval shape, or a bar shape. The data storage pattern DSP may conformally cover the inner sidewall of the vertical channel hole CH. The vertical semiconductor pattern VSP may be provided between the data storage pattern DSP and the buried dielectric pattern VI, and may conformally cover an inner sidewall of the data storage pattern DSP. The vertical semiconductor pattern VSP may have a macaroni shape or a pipe shape whose bottom end is closed. The data storage pattern DSP may have a macaroni shape or a pipe shape whose bottom end is opened. As discussed below with reference to FIG. 10, the vertical semiconductor pattern VSP may be in contact with a portion of the source structure SC.

The data storage pattern DSP may include a plurality of dielectric layers that are sequentially stacked on the inner sidewall of the vertical channel hole CH. The vertical semiconductor pattern VSP may include, for example, an impurity-doped semiconductor material, an impurity-undoped intrinsic semiconductor material, or a polycrystalline semiconductor material. The buried dielectric pattern VI may include, for example, silicon oxide. The conductive pad PAD may include, for example, an impurity-doped semiconductor material or a conductive material.

On the second region R2, a plurality of dummy vertical channel structures DVS may be provided to penetrate the stack structure ST and the source structure SC. For example, the dummy vertical channel structures DVS may penetrate the pad parts ELp. One or more of the dummy vertical channel structures DVS may further penetrate a second dielectric layer 210 that covers the pad parts ELp.

The dummy vertical channel structures DVS may be provided around cell contact plugs CP which will be discussed. The dummy vertical channel structures DVS may not be provided on the first region R1. The dummy vertical channel structures DVS and the vertical channel structures VS may be formed simultaneously with each other and may have substantially the same structure. However, the dummy vertical channel structures DVS may not be provided in accordance with some example embodiments.

The second region R2 may be provided thereon with the second dielectric layer 210 that covers the stack structure ST. For example, the second dielectric layer 210 may be provided on the pad parts ELp while covering the stepwise structure of the stack structure ST. The second dielectric layer 210 may have a top surface that is substantially flat. The second dielectric layer 210 may have a top surface substantially coplanar with an uppermost surface of the stack structure ST. For example, the top surface of the second dielectric layer 210 may be substantially coplanar with that of the uppermost one of the interlayer dielectric layers ILD in the stack structure ST.

The second dielectric layer 210 may include a single dielectric layer or a plurality of stacked dielectric layers. The second dielectric layer 210 may include a dielectric material, for example, one or more of silicon oxide, silicon nitride, silicon oxynitride, and low-k dielectrics. The second dielectric layer 210 may include a dielectric material different from that of the interlayer dielectric layers ILD in the stack structure ST. For example, when the interlayer dielectric layers 120 of the stack structure ST include high density plasma oxide, the second dielectric layer 210 may include tetraethylorthosilicate (TEOS).

A first separation structure SS1 may be provided in a first trench TR1 that runs in the first direction D1 across an upper portion of the stack structure ST. The first separation structure SS1 may be provided between the first string selection electrode SSLa and the second string selection electrode SSLb. The first trench TR1 may have a depth less than that of a second trench TR2, which will be discussed below. The first trench TR1 may have a bottom surface located at a lower level than that of a bottom surface of each of the first and second upper string selection electrodes SSL2a and SSL2b. The bottom surface of the first trench TR1 may be located at substantially the same as that of a bottom surface of each of the first and second lower string selection electrodes SSL1a and SSL1b. For example, the first separation structure SS1 that fills the first trench TR1 may overlap in the second direction D2 with the first and second string selection electrodes SSLa and SSLb and may be in direct contact with the first and second string selection electrodes SSLa and SSLb. The first separation structure SS1 may be spaced apart in the second direction D2 from the vertical channel structures VS.

The first separation structure SS1 may have a top surface that has a linear shape (or a flat shape) when viewed in a plan view. The first separation structure SS1 may have a length in the first direction D1 less than a length in the first direction D1 of a second separation structure SS2, which will be discussed below. The first separation structures SS1 may have a width in the second direction D2 that is less than a width in the second direction D2 of the second separation structure SS2. The first separation structure SS1 may include, for example, silicon oxide.

When the stack structure ST is provided in plural, a second separation structure SS2 may be provided in a second trench TR2 that runs between the plurality of stack structures ST in the first direction D1.

The second separation structure SS2 may have a top surface that has a linear shape (or a flat shape) when viewed in a plan view. The second separation structure SS2 may extend from the first region R1 toward the second region R2. The second separation structure SS2 may be spaced apart in the second direction D2 from the vertical channel structures VS, the dummy vertical channel structures DVS, and cell contact plugs CP, which will be discussed below. The top surface of the second separation structure SS2 may be located at a higher level than that of top surfaces of the first and second upper string selection electrodes SSL2a and SSL2b. The second separation structure SS2 may have a bottom surface located at a lower level than that of a top surface of the source structure SC (or a top surface of the second source conductive pattern SCP2). The second separation structure SS2 may have a width in the second direction D2. The width of the second separation structure SS2 may increase in the third direction D3 for example.

The second separation structure SS2 may be provided in plural, and the plurality of second separation structures SS2 may be spaced apart in the second direction D2 from each other across the stack structure ST. The second separation structure SS2 may correspond to the separation structures 3230 of FIGS. 3 and 4. The second separation structure SS2 may include, for example, silicon oxide.

A third dielectric layer 230 may be provided on the second dielectric layer 210 and the stack structure ST. The third dielectric layer 230 may cover the top surface of the second dielectric layer 210, the top surface of the uppermost interlayer dielectric layer ILD of the stack structure ST, the top surfaces of the vertical channel structures VS, top surfaces of the dummy vertical channel structures DVS.

The third dielectric layer 230 may include a single dielectric layer or a plurality of stacked dielectric layers. The third dielectric layer 230 may include, for example, one or more of silicon oxide, silicon nitride, silicon oxynitride, and low-k dielectrics. The third dielectric layer 230 may include, for example, a dielectric material substantially the same as that of the second dielectric layer 210.

Bit-line contact plugs BP may be provided to penetrate the third dielectric layer 230 and to connect with the vertical channel structures VS. Cell contact plugs CP may be provided to penetrate the third dielectric layer 230 and the second dielectric layer 210 and to connect with the gate electrodes EL, the first and second string selection electrodes SSLa and SSLb. Each of the cell contact plugs CP may penetrate one of the interlayer dielectric layers ILD to come into contact with one of the pad parts ELp. Each of the cell contact plugs CP may be adjacent to a plurality of dummy vertical channel structures DVS and may be spaced apart from each other. The cell contact plugs CP may correspond to the gate connection lines 3235 of FIG. 4. The bit-line contact plugs BP and the cell contact plugs CP may have their widths in the first direction D1 or the second direction D2 that increase in the third direction D3 for example.

The third dielectric layer 230 may be provided thereon with bit lines BL that are correspondingly connected to the bit-line contact plugs BP. The bit lines BL may correspond to the bit line BL of FIG. 1 or the bit lines 3240 of FIGS. 3 and 4.

The third dielectric layer 230 may be provided thereon with conductive lines CL connected to the cell contact plugs CP. The conductive lines CL may correspond to the conductive lines 3250 of FIG. 4.

The bit-line contact plugs BP, the cell contact plugs CP, the bit lines BL, and the conductive lines CL may include a conductive material, such as metal.

The third dielectric layer 230 may be provided thereon with a fourth dielectric layer 250 that covers the bit lines BL and the conductive lines CL. The fourth dielectric layer 250 may include a single dielectric layer or a plurality of stacked dielectric layers. The fourth dielectric layer 250 may include, for example, one or more of silicon oxide, silicon nitride, silicon oxynitride, and low-k dielectrics.

Although not shown, the fourth dielectric layer 250 may further be provided therein (or thereon) with additional vias and additional lines electrically connected to the bit lines BL and the conductive lines CL.

Referring to FIGS. 5 and 6, the vertical channel structures VS may include first to eighth vertical channel structures VS1 to VS8. The number of the vertical channel structures VS arranged along the second direction D2 may be an even number. Eight vertical channel structures VS are illustrated and explained, but this is merely an example and the present inventive concepts are not limited thereto.

Each of the first to eighth vertical channel structures VS1 to VS8 may be provided in plural numbers along the first direction D1. The first vertical channel structures VS1 may be adjacent to one of the second separation structures SS2, the eighth vertical channel structures VS8 may be adjacent to another of the second separation structures SS2, and the fourth vertical channel structures VS4 and the fifth vertical channel structures VS5 may be adjacent to the first separation structure SS1. The second and third vertical channel structures VS2 and VS3 may be provided between the first vertical channel structures VS1 and the fourth vertical channel structures VS4, and the sixth and seventh vertical channel structures VS6 and VS7 may be provided between the fifth vertical channel structures VS5 and the eighth vertical channel structures VS8. For convenience of description, the following will describe a single first vertical channel structure VS1 to a single eighth vertical channel structure VS8.

The first, third, sixth, and eighth vertical channel structures VS1, VS3, VS6, and VS8 may be aligned with each other in the second direction D2. The second, fourth, fifth, and seventh vertical channel structures VS2, VS4, VS5, and VS7 may be aligned with each other in the second direction D2. The first to fourth vertical channel structures VS1 to VS4 may be symmetrically disposed with the fifth to eighth vertical channel structures VS5 to VS8 with respect to the first separation structure SS1.

The fourth vertical channel structure VS4 may be spaced apart in the second direction D2 from the fifth vertical channel structure VS5 across the first separation structure SS1. Each of the fourth and fifth vertical channel structures VS4 and VS5 may be spaced apart from the first separation structure SS1 across either the first string selection electrode SSLa or the second string selection electrode SSLb. For example, either the first string selection electrode SSLa or the second string selection electrode SSLb may surround the fourth and fifth vertical channel structures VS4 and VS5 that are adjacent to the first separation structure SS1.

The bit lines BL may be provided to connect with the first to eighth vertical channel structures VS1 to VS8. Each of the first to eighth vertical channel structures VS1 to VS8 (e.g., a conductive pad of each of vertical channel structures) may overlap in a vertical direction (e.g., the third direction D3) with two bit lines BL. Although twelve bit lines BL are illustrated, this is merely an example and the present inventive concepts are not limited thereto. The bit lines BL may include first to fourth bit lines BL1 to BL4 that cross over the first to eighth vertical channel structures VS1 to VS8 in the second direction D2. The first to fourth bit lines BL1 to BL4 may be arranged along the first direction D1.

First to eighth bit-line contact plugs BP1 to BP8 may be provided to connect the first to eighth vertical channel structures VS1 to VS8 to the first to fourth bit lines BL1 to BL4, respectively. The first vertical channel structure VS1 and the sixth vertical channel structure VS6 may be connect in common to the first bit line BL1 through the first bit-line contact plug BP1 and the sixth bit-line contact plug BP6, respectively. The third vertical channel structure VS3 and the eighth vertical channel structure VS8 may be connected in common to the second bit line BL2 through the third bit-line contact plug BP3 and the eighth bit-line contact plugs BP8, respectively. The second vertical channel structure VS2 and the seventh vertical channel structure VS7 may be connected in common to the third bit line BL3 through the second bit-line contact plug BP2 and the seventh bit-line contact plug BP7, respectively. The fourth vertical channel structure VS4 and the fifth vertical channel structure VS5 that are adjacent to the first separation structure SS1 may be connected in common to the fourth bit line BL4 through the fourth bit-line contact plug BP4 and the fifth bit-line contact plug BP5, respectively.

As vertical channel structures that are adjacent in the second direction D2 to each other across the first separation structure SS1 (e.g., vertical channel structures with a likelihood of degradation in electrical characteristics) are connected in common to one of the bit lines BL, it may be possible to reduce possibility of degradation in cell characteristics and as a result to improve reliability and electrical characteristics of three-dimensional semiconductor memory devices according to the present inventive concepts. In detail, a case that vertical channel structures with a possibility of degradation of cell characteristics are connected to the same bit line is better than a case that a vertical channel structure with a possibility of degradation of cell characteristics is connected to the same bit line with another normal vertical channel structure, in perspective of reliability and electrical characteristics.

The first separation structure SS1 may include a first part SS1$p$1 that is adjacent in the second direction D2 to the fourth and fifth vertical channel structures VS4 and VS5, and a second part SS1$p$2 that is connected to the first part SS1$p$1 and has a uniform width. The first part SS1$p$1 of the first separation structure SS1 may be spaced in the second direction D2 from the fourth and fifth vertical channel structures VS4 and VS5 across either the first string selection electrode SSLa or the second string selection electrode SSLb. No uniformity may be given to the width in the second direction D2 of the first part SS1$p$1 of the first separation structure SS1. For example, the width in the second direction D2 of the first part SS1$p$1 included in the first separation structure SS1 may repeatedly increase and decrease in the first direction D1.

Figure 8:
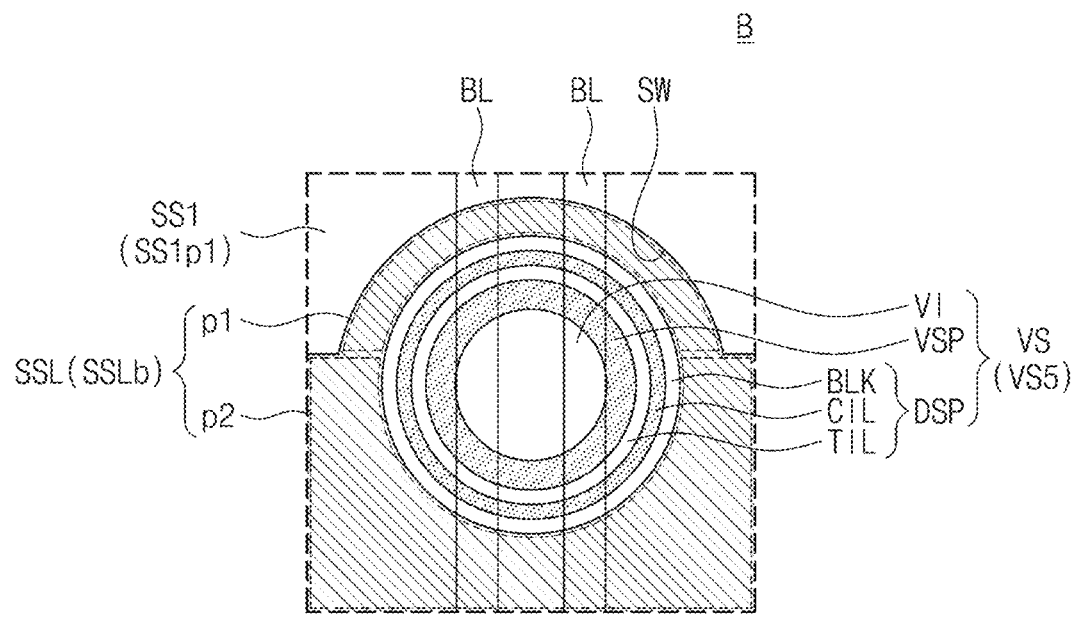
FIGS. 8 and 9 illustrate enlarged views showing section B of FIG. 6, partially showing a three-dimensional semiconductor memory device according to some example embodiments of the present inventive concepts.
Figure 9:
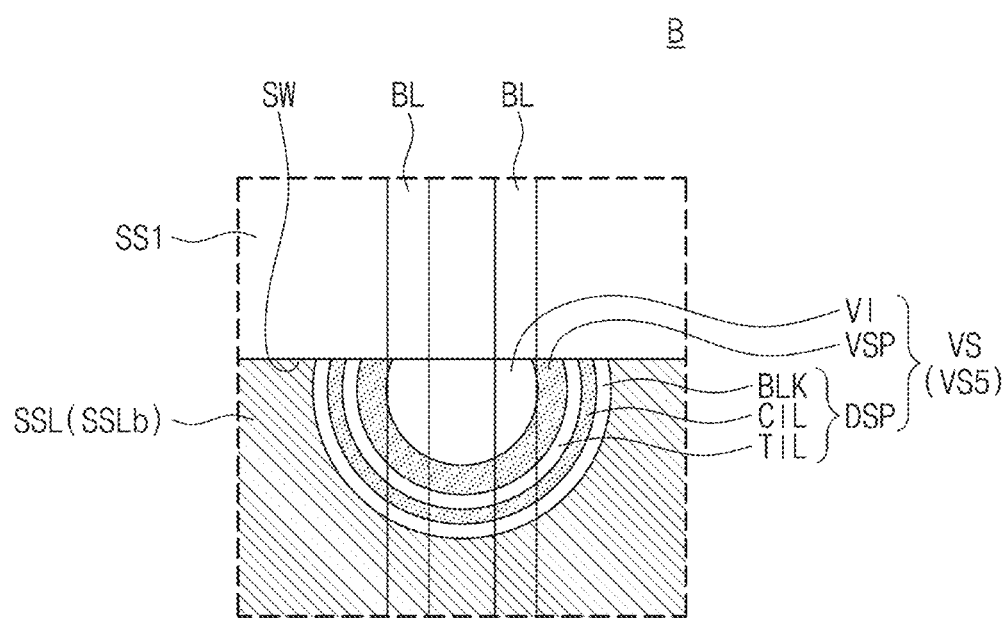

FIGS. 8 and 9 illustrate enlarged views showing section B of FIG. 6, partially showing a three-dimensional semiconductor memory device according to some example embodiments of the present inventive concepts.

Referring to FIGS. 6 and 8, a string selection electrode SSL (or the first string selection electrode SSLa or the second string selection electrode SSLb) may be provided between the vertical channel structure VS and a sidewall SW of the first separation structure SS1, and may include a first part p1 that surrounds one side of the vertical channel structure VS, and a second part p2 that connects with the first part p1 and surrounds another side of the vertical channel structure VS. When viewed in a plan view, the first part p1 of the string selection electrode SSL may have a curved shape along the sidewall SW of the first separation structure SS1. The vertical channel structure VS may be spaced apart from the first separation structure SS1 across the first part p1 of the string selection electrode SSL. For example, the vertical channel structure VS may not be in contact with the first separation structure SS1.

The vertical channel structure VS may have a part that overlaps in the first direction D1 with the first separation structure SS1, and the part of the vertical channel structure VS may have a maximum width of about 10 nm to about 150 nm in the second direction D2.

Referring to FIGS. 6 and 9, according to some example embodiments, the first separation structure SS1 may have a uniform width and the vertical channel structure VS may have a semicircular shape or an arch shape (e.g., bow or crescent shape) on the top surface thereof. Thus, the vertical channel structure VS may be in contact with the sidewall SW of the first separation structure SS1.

Figure 10:
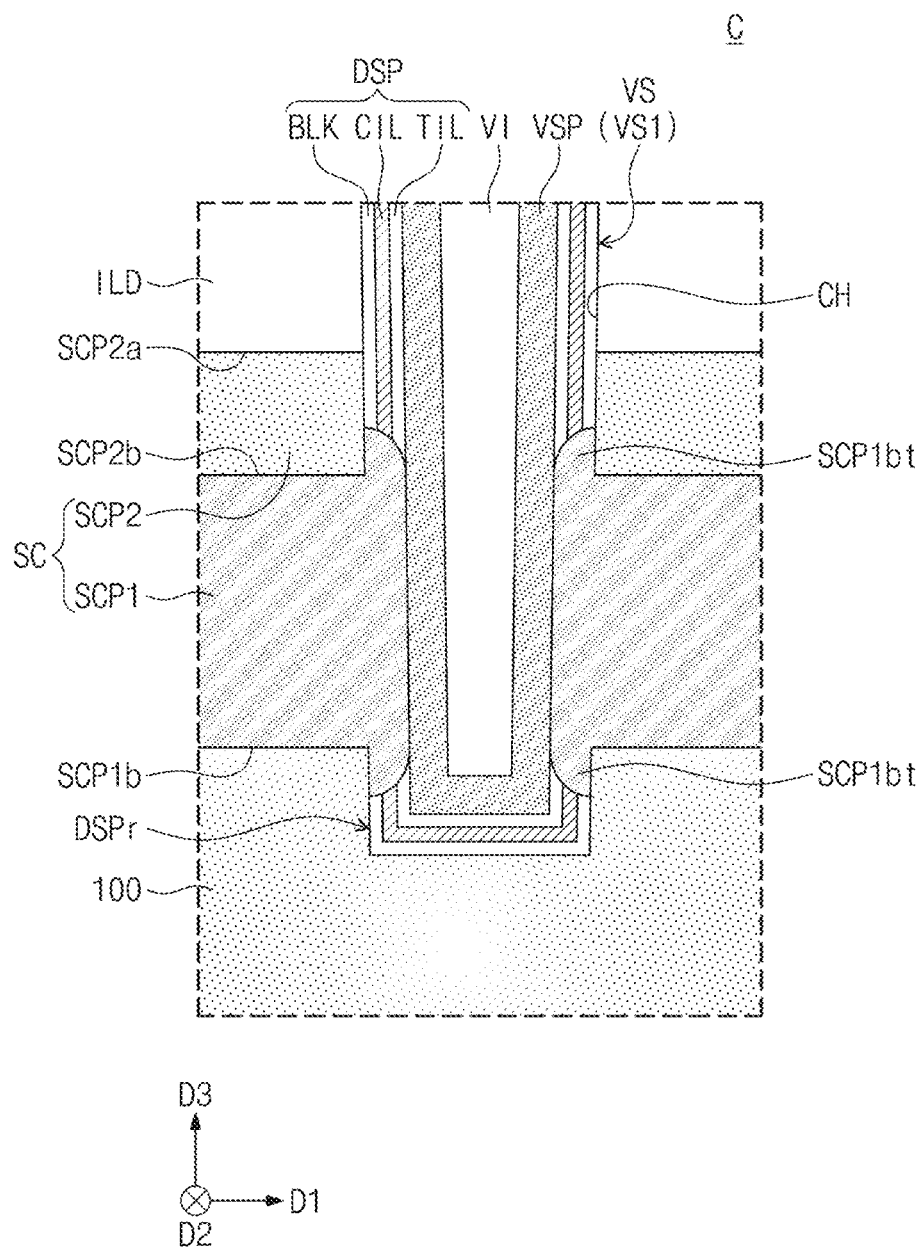
FIG. 10 illustrates an enlarged view showing section C of FIG. 7A, partially showing a three-dimensional semiconductor memory device according to some example embodiments of the present inventive concepts.

FIG. 10 illustrates an enlarged view showing section C of FIG. 7A, partially showing a three-dimensional semiconductor memory device according to some example embodiments of the present inventive concepts.

Referring to FIGS. 7A, 7B, and 10, there is illustrated the source structure SC including the first and second source conductive patterns SCP1 and SCP2 and is further illustrated one of the vertical channel structures VS each including the data storage pattern DSP, the vertical semiconductor pattern VSP, the buried dielectric pattern VI, and a lower data storage pattern DSPr. For convenience of description, the following explanation will focus on a single stack structure ST and a single vertical channel structure VS, but this explanation may also be applicable to other vertical channel structures VS that penetrate other stack structures ST.

The data storage pattern DSP may include a blocking dielectric layer BLK, a charge storage layer CIL, and a tunneling dielectric layer TIL that are sequentially stacked. The blocking dielectric layer BLK may be adjacent to the stack structure ST or the source structure SC, and the tunneling dielectric layer TIL may be adjacent to the vertical semiconductor pattern VSP. The charge storage layer CIL may be interposed between the blocking dielectric layer BLK and the tunneling dielectric layer TIL. The blocking dielectric layer BLK may cover the inner sidewall of the vertical channel hole CH. The blocking dielectric layer BLK may be in contact with the sidewalls of the interlayer dielectric layers ILD and with the sidewalls of the gate electrodes EL.

The blocking dielectric layer BLK, the charge storage layer CIL, and the tunneling dielectric layer TIL may extend in the third direction D3 between the stack structure ST and the vertical semiconductor pattern VSP. The data storage pattern DSP may store and/or change data by using Fowler-Nordheim tunneling induced by a voltage difference between the vertical semiconductor pattern VSP and the gate electrodes EL. For example, the blocking dielectric layer BLK and the tunneling dielectric layer TIL may include silicon oxide, and the charge storage layer CIL may include silicon nitride or silicon oxynitride.

The first source conductive pattern SCP1 of the source structure SC may be in contact with the vertical semiconductor pattern VSP, and the second source conductive pattern SCP2 of the source structure SC may be spaced apart from the vertical semiconductor pattern VSP across the data storage pattern DSP. The first source conductive pattern SCP1 may be spaced apart from the buried dielectric pattern VI across the vertical semiconductor pattern VSP.

For example, the first source conductive pattern SCP1 may include protruding parts SCP1*bt* located at a level higher than that of a bottom surface SCP2*b* of the second source conductive pattern SCP2 and/or at a level lower than that of a bottom surface SCP1*b* of the first source conductive pattern SCP1. The protruding parts SCP1*bt* may be located at a level lower than that of a top surface SCP2*a* of the second source conductive pattern SCP2. The protruding parts SCP1*bt* may each have, for example, a curved shape at a surface in contact with the data storage pattern DSP or the lower data storage pattern DSPr.

Figure 11:
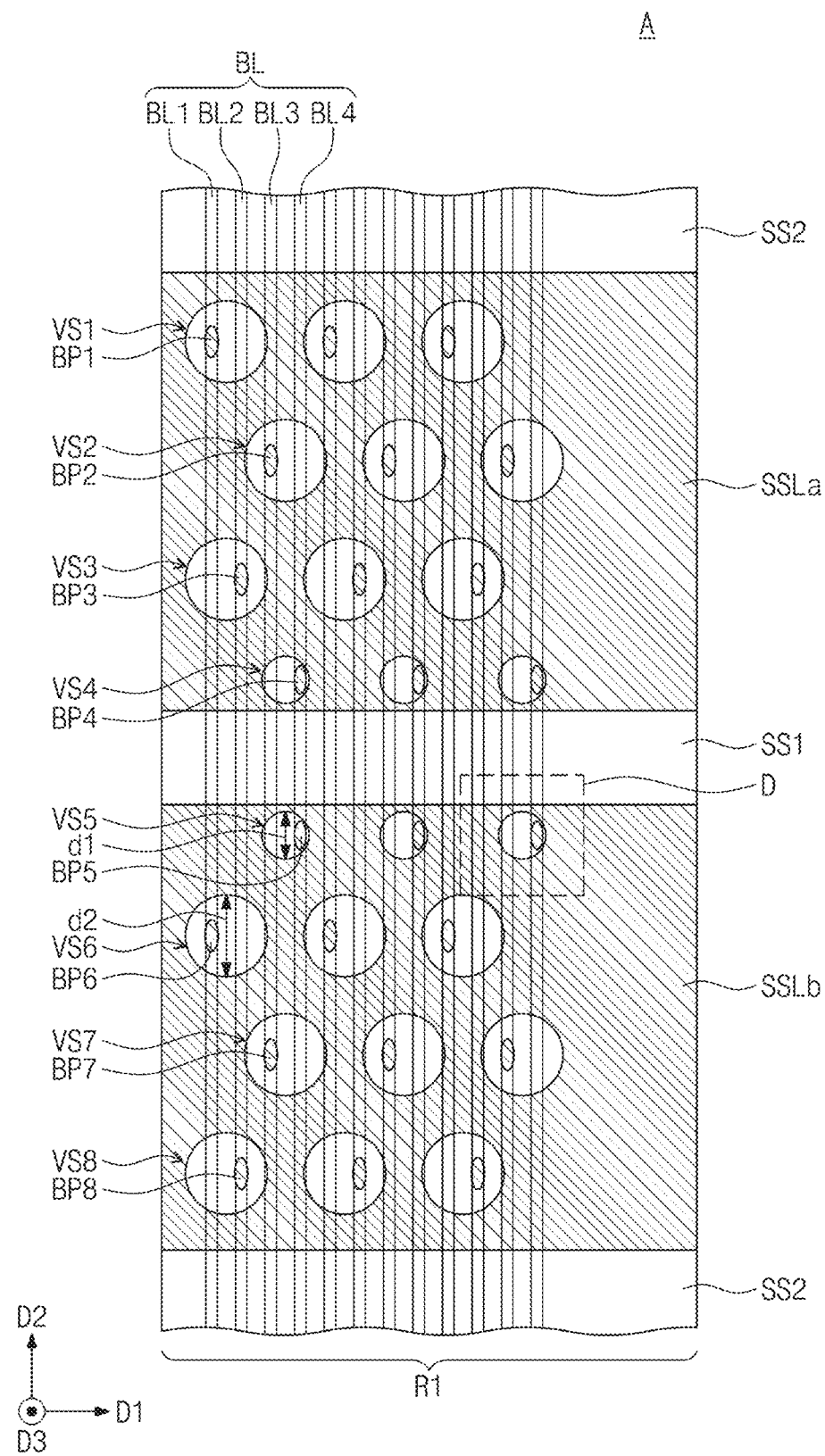
FIGS. 11 and 13 illustrate plan views showing section A of FIG. 5, showing a three-dimensional semiconductor memory device according to some example embodiments of the present inventive concepts.
Figure 12:
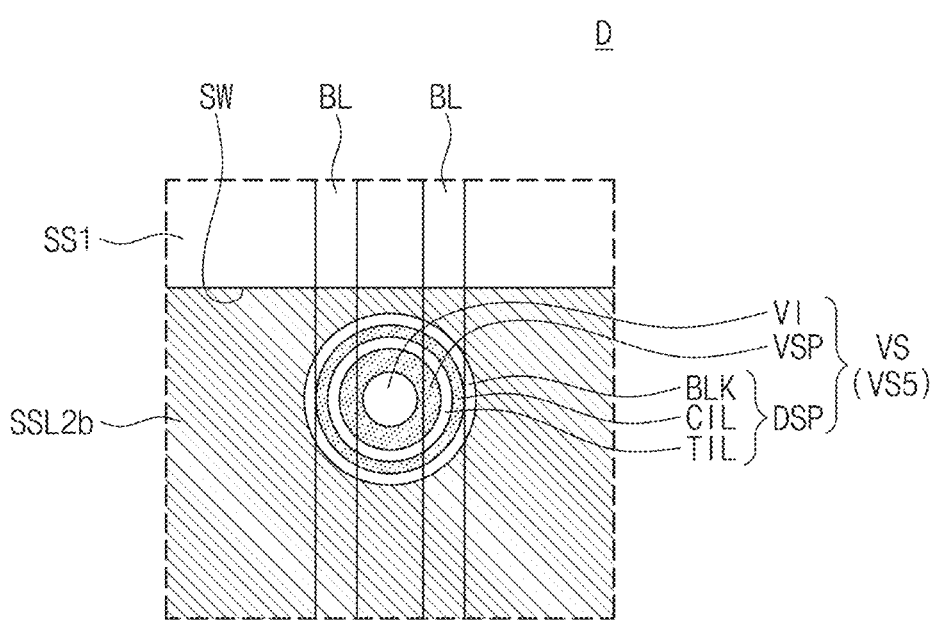
FIGS. 12 and 14 illustrate enlarged views showing section D of FIG. 11 and section E of FIG. 13, respectively, that partially show a three-dimensional semiconductor memory device according to some example embodiments of the present inventive concepts.

FIG. 11 illustrates a plan view showing section A of FIG. 5, showing a three-dimensional semiconductor memory device according to some example embodiments of the present inventive concepts. FIG. 12 illustrates an enlarged view showing section D of FIG. 11, partially showing a three-dimensional semiconductor memory device according to some example embodiments of the present inventive concepts. A description of components substantially the same as those discussed above will be omitted below for brevity of description, and a difference thereof will be explained in detail.

Referring to FIGS. 11 and 12, the fourth and fifth vertical channel structures VS4 and VS5 may each have a top surface whose size is the same as or smaller than that of a top surface of each of other vertical channel structures (or the first to third and sixth to eighth vertical channel structures VS1 to VS3 and VS6 to VS8). For example, the fourth and fifth vertical channel structures VS4 and VS5 may each have a first diameter d1 at the top surface thereof, and the first to third and sixth to eighth vertical channel structures VS1 to VS3 and VS6 to VS8 may each have a second diameter d2 at the top surface thereof. The first diameter d1 may be the same as or less than the second diameter d2. The second diameter d2 may range, for example, from about 100 nm to about 200 nm. The second diameter d2 may range, for example, from about 130 nm to about 150 nm.

Each of the fourth and fifth vertical channel structures VS4 and VS5 may be spaced apart in the second direction D2 from the sidewall SW of the first separation structure SS1 across a portion the string selection electrode SSL (or the first string selection electrode SSLa or the second string selection electrode SSLb).

Figure 13:
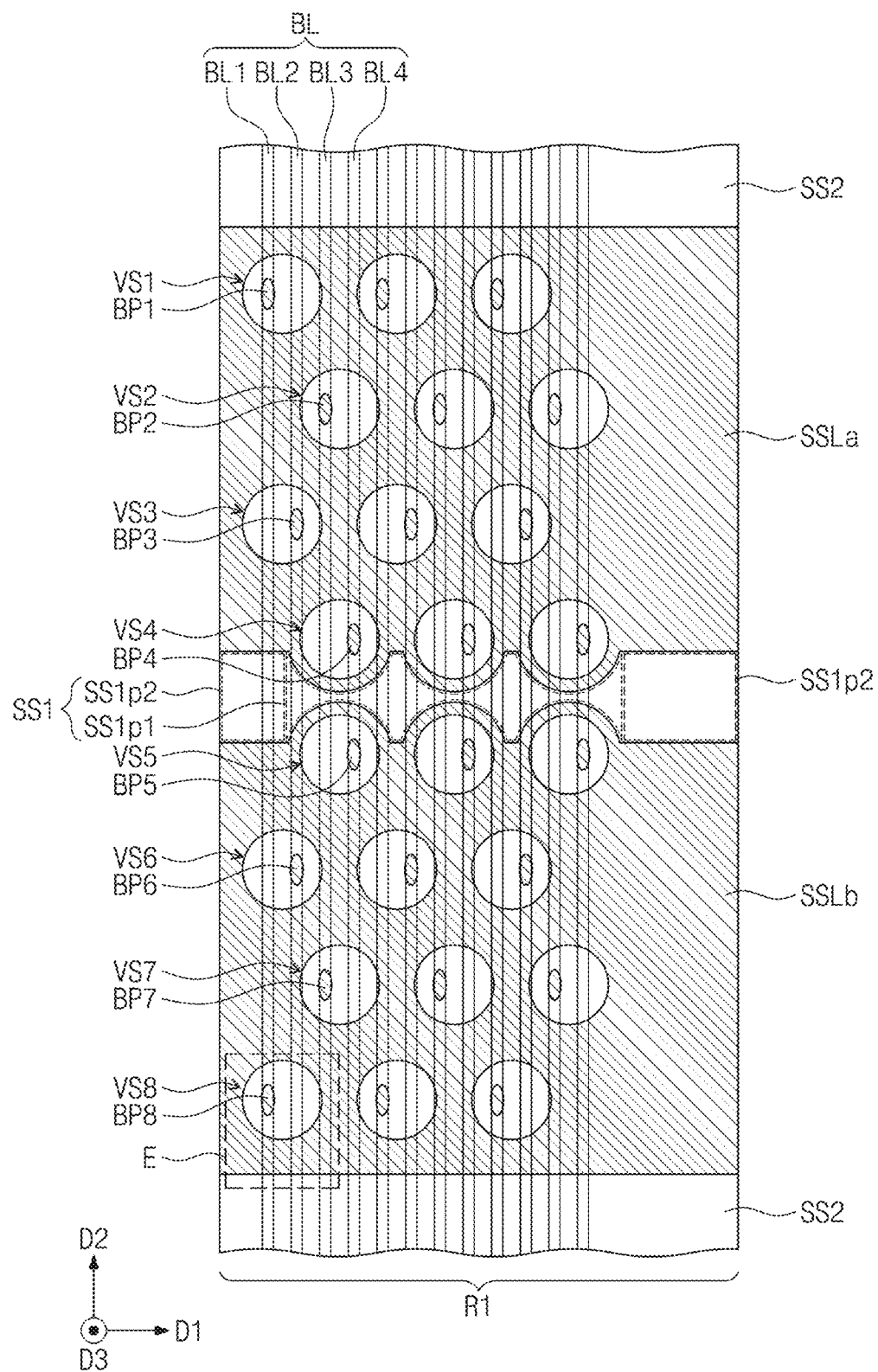
Figure 14:
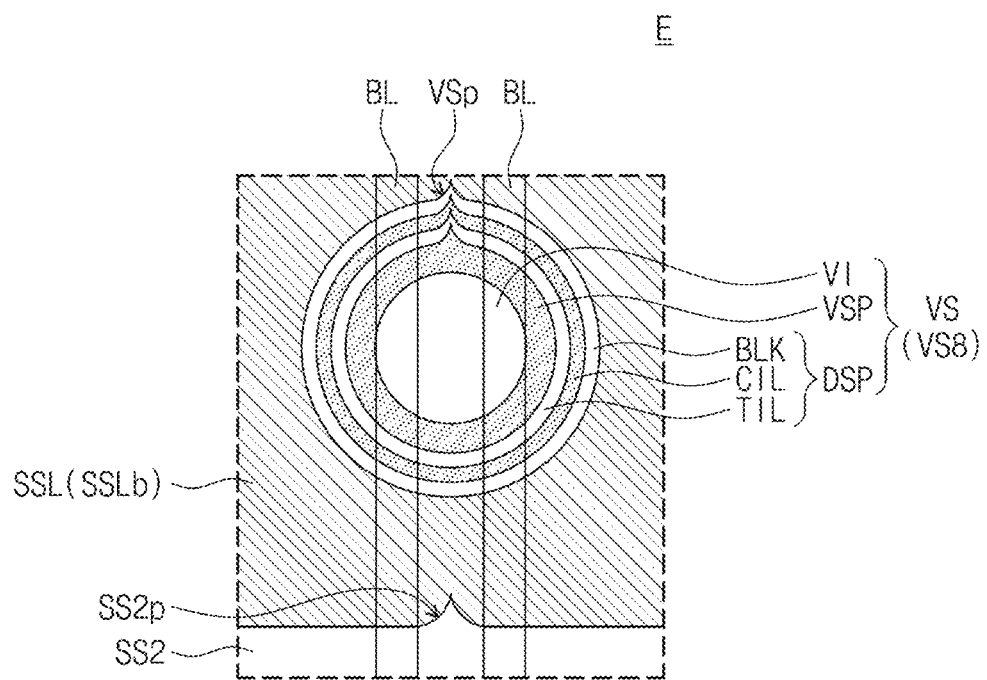

FIG. 13 illustrates a plan view showing section A of FIG. 5, showing a three-dimensional semiconductor memory device according to some example embodiments of the present inventive concepts. FIG. 14 illustrates an enlarged view showing section E of FIG. 13, partially showing a three-dimensional semiconductor memory device according to some example embodiments of the present inventive concepts. A description of components substantially the same as those discussed above will be omitted below for brevity of description, and a difference thereof will be explained in detail.

Referring to FIG. 13, the first vertical channel structure VS1 and the eighth vertical channel structure VS8 that are adjacent to one of the second separation structures SS2 may be connected in common to the first bit line BL1 through the first bit-line contact plug BP1 and the eighth bit-line contact plug BP8, respectively. The third vertical channel structure VS3 and the sixth vertical channel structure VS6 may be connected in common to the second bit line BL2 through the third bit-line contact plug BP3 and the sixth bit-line contact plug BP6, respectively. The second vertical channel structure VS2 and the seventh vertical channel structure VS7 may be connected in common to the third bit line BL3 through the second bit-line contact plug BP2 and the seventh bit-line contact plug BP7, respectively. The fourth vertical channel structure VS4 and the fifth vertical channel structure VS5 that are adjacent to the first separation structure SS1 may be connected in common to the fourth bit line BL4 through the fourth bit-line contact plug BP4 and the fifth bit-line contact plug BP5, respectively.

Referring to FIGS. 13 and 14, there is illustrated the eighth vertical channel structure VS8 adjacent to one of the second separation structures SS2. The first vertical channel structure VS1 may have a shape substantially the same as that of the eighth vertical channel structure VS8.

The vertical channel structure VS (or the eighth vertical channel structure VS8) may include a protruding part VSp. Each of the second separation structures SS2 may include a protruding part SS2*p* that protrudes toward the vertical channel structure VS. The protruding part SS2*p* of each of the separation structures SS2 may be spaced apart from the vertical channel structure VS. The protruding part VSp of the vertical channel structure VS may protrude in the same direction in which the protruding part SS2*p* of the second separation structure SS2 protrudes.

As vertical channel structures that include their protruding parts VSp and are correspondingly adjacent to the second separation structures SS2 (or vertical channel structures with likelihood of degradation in electrical characteristics) in the second direction D2 are connected in common to one of the bit lines BL, it may be possible to reduce possibility of degradation in cell characteristics and as a result to improve reliability and electrical characteristics of three-dimensional semiconductor memory devices according to the present inventive concepts. In detail, a case that vertical channel structures with a possibility of degradation of cell characteristics are connected to the same bit line is better than a case that a vertical channel structure with a possibility of degradation of cell characteristics is connected to the same bit line with another normal vertical channel structure, in perspective of reliability and electrical characteristics.

FIGS. 15A, 16A, 17A, and 18A illustrate plan views showing section A of FIG. 5, showing a method of fabricating a three-dimensional semiconductor memory device according to some example embodiments of the present inventive concepts. FIGS. 15B, 16B, 17B, and 18B illustrate cross-sectional views taken along line II-II' of FIGS. 15A, 16A, 17A, and 18A, respectively, showing a method of fabricating a three-dimensional semiconductor memory device according to some example embodiments of the present inventive concepts. With reference to FIGS. 15A and 15B to 18A and 18B, the following discuss in detail a method of fabricating a three-dimensional semiconductor memory device according to some example embodiments of the present inventive concepts.

Figure 15A:
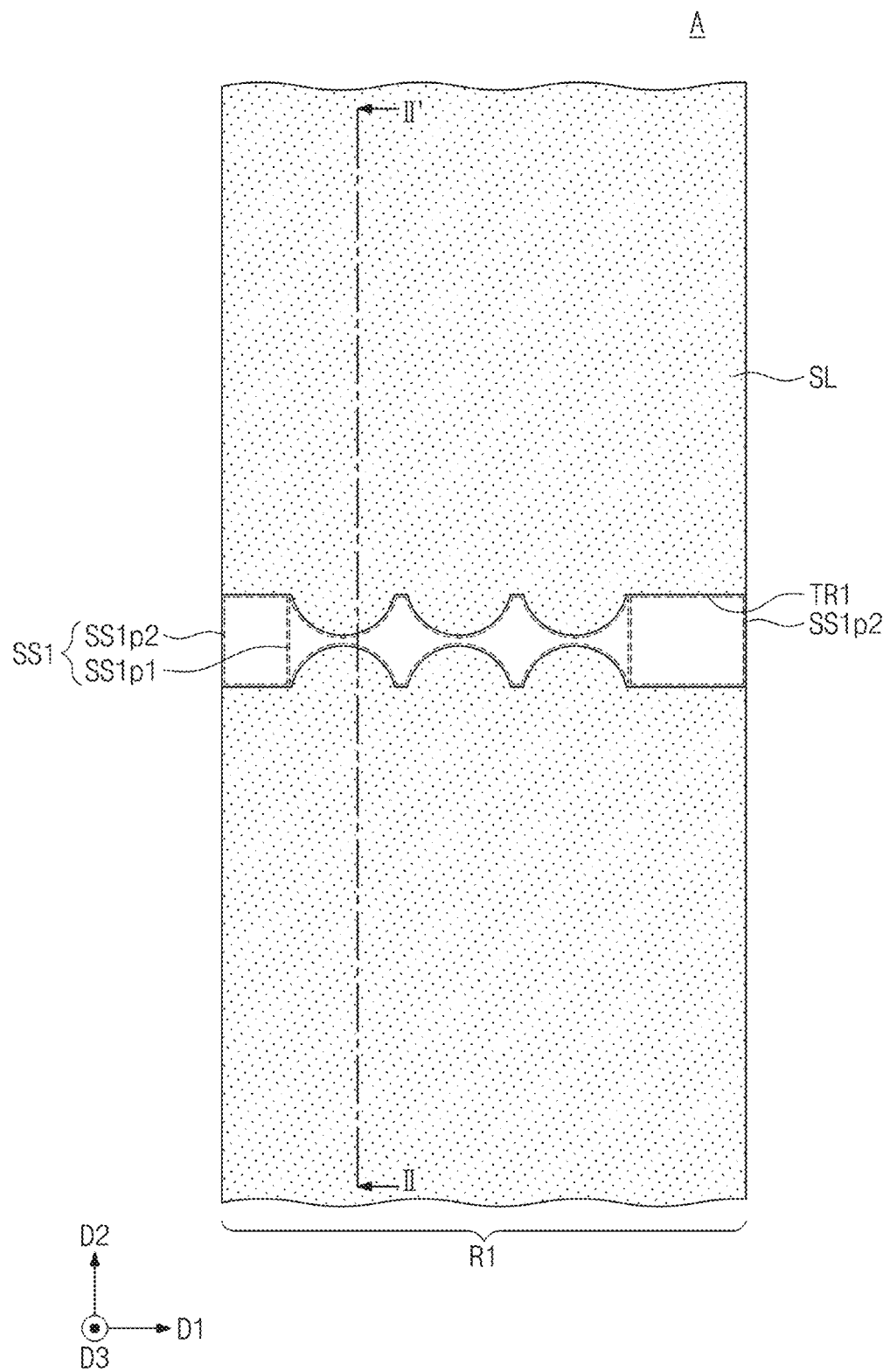
FIGS. 15A, 16A, 17A, and 18A illustrate plan views showing section A of FIG. 5, showing a method of fabricating a three-dimensional semiconductor memory device according to some example embodiments of the present inventive concepts.
Figure 15B:
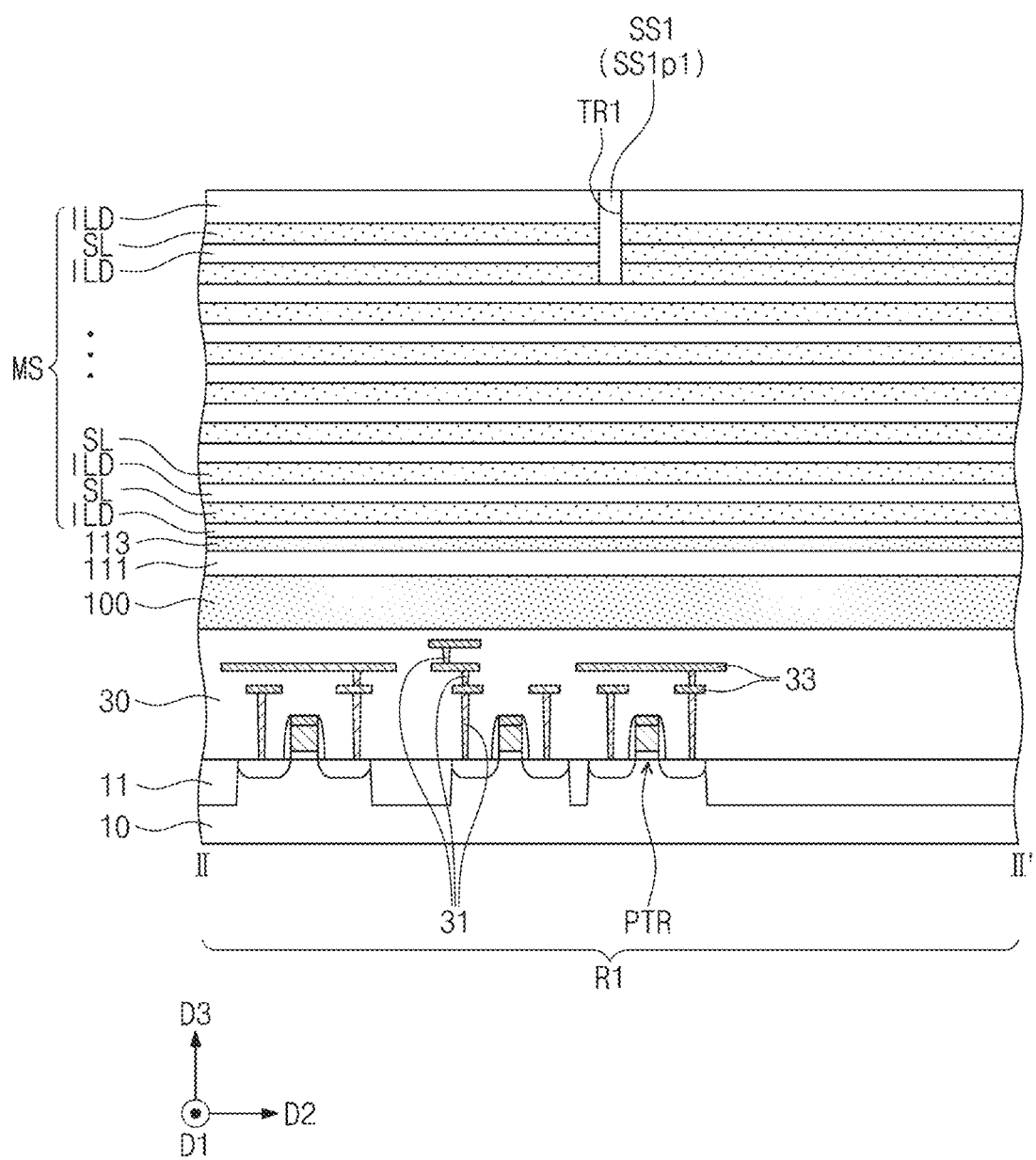
FIGS. 15B, 16B, 17B, and 18B illustrate cross-sectional views taken along line II-II' of FIGS. 15A, 16A, 17A, and 18A, respectively, showing a method of fabricating a three-dimensional semiconductor memory device according to some example embodiments of the present inventive concepts.

Referring to FIGS. 5, 15A, and 15B, a first substrate 10 may be provided which includes a first region R1 and a second region R2. A device isolation layer 11 may be formed in the first substrate 10, defining an active section. The formation of the device isolation layer 11 may include forming a trench on an upper portion of the first substrate 10 and filling the trench with silicon oxide.

Peripheral circuit transistors PTR may be formed on the active section defined by the device isolation layer 11. Peripheral contact plugs 31 and peripheral circuit lines 33 may be formed to connect with peripheral source/drain regions 29 of the peripheral contact plugs 31. A first dielectric layer 30 may be formed to cover the peripheral circuit transistors PTR, the peripheral contact plugs 31, and the peripheral circuit lines 33.

A second substrate 100 may be formed on the first dielectric layer 30. The second substrate 100 may be formed by depositing a semiconductor material.

A lower sacrificial layer 111 and a lower semiconductor layer 113 may be formed on the second substrate 100. The lower sacrificial layer 111 may be formed by, for example, depositing a single dielectric layer or a plurality of stacked dielectric layers. The lower sacrificial layer 111 may be formed of, for example, one or more of silicon oxide, silicon nitride, silicon oxynitride, and low-k dielectrics. For example, the lower sacrificial layer 111 may be formed of silicon oxide. For another example, the lower sacrificial layer 111 may be formed by alternately depositing silicon oxide and silicon nitride. The lower semiconductor layer 113 may be formed of a semiconductor material, such as silicon.

A mold structure MS may be formed on the lower semiconductor layer 113. The mold structure MS may be formed by alternately forming interlayer dielectric layers ILD and sacrificial layers SL on the lower semiconductor layer 113. The sacrificial layers SL may be formed of a material having an etch selectivity with respect to the interlayer dielectric layers ILD. For example, the sacrificial layers SL may be formed of silicon nitride, and the interlayer dielectric layers ILD may be formed of silicon oxide.

A first separation structure SS1 may be formed to run in a first direction D1 across an upper portion of the mold structure MS. The formation of the first separation structure SS1 may include forming a mask pattern on the mold structure MS, using the mask pattern to pattern a portion of the mold structure MS to form a first trench TR1, and filling the first trench TR1 with a dielectric material. In this case, the mask pattern may have an opening whose width in a second direction D2 is not uniform, and thus the first separation structure SS1 may be formed to include a first part SS1$p$1 and a second part SS1$p$2. The first separation structure SS1 may be formed of, for example, silicon oxide.

Figure 16A:
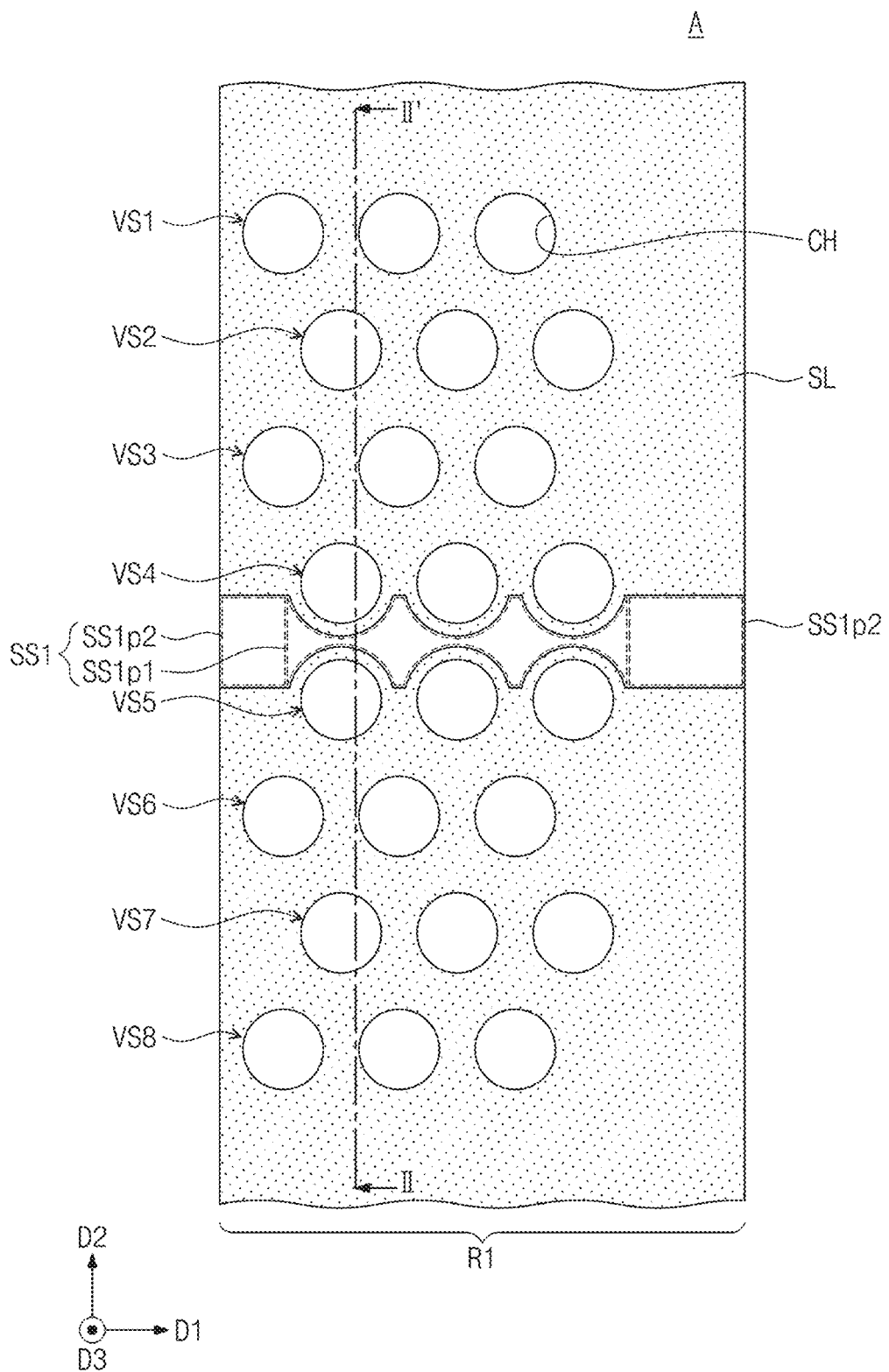
Figure 16B:
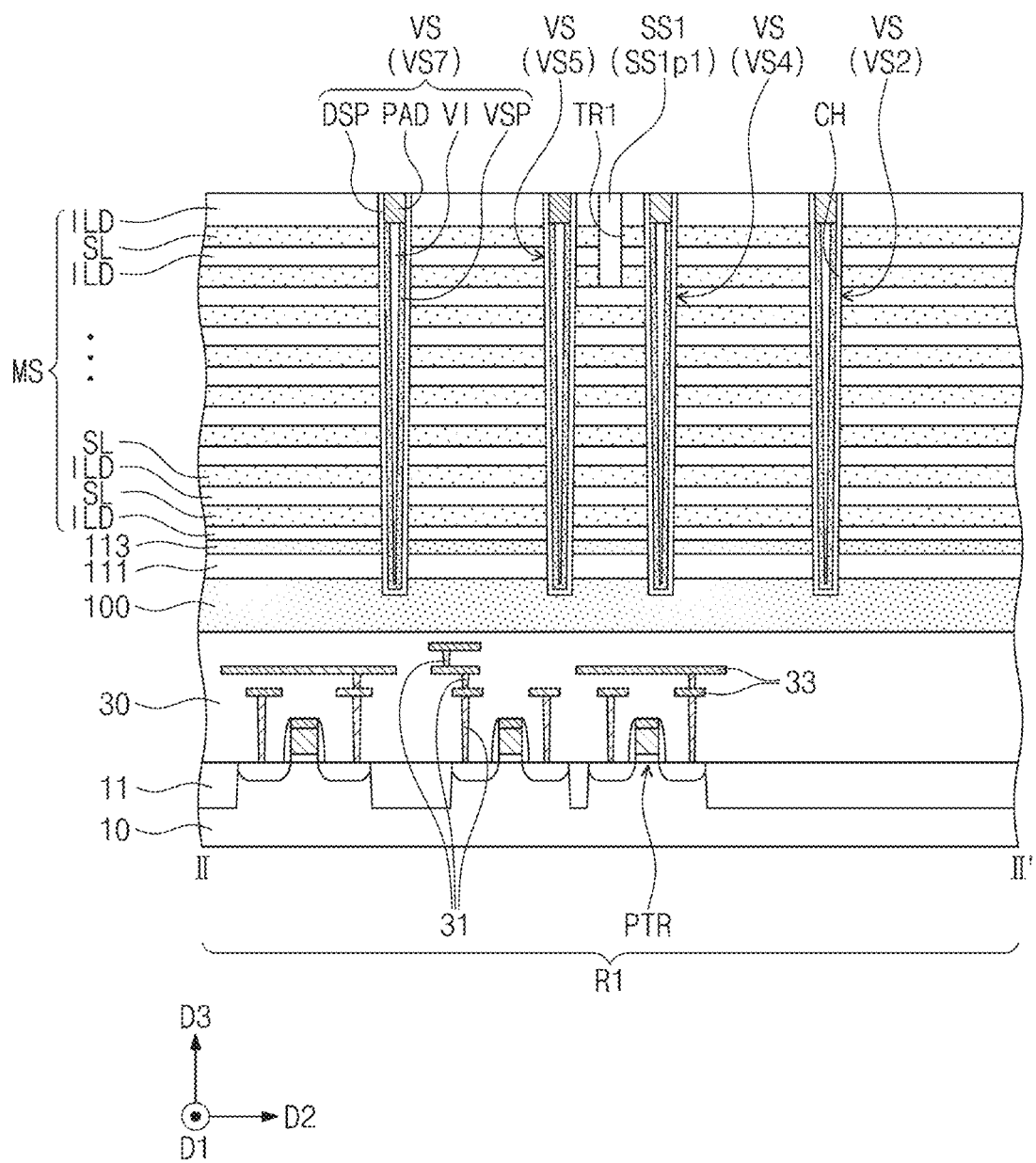

Referring to FIGS. 5, 16A, and 16B, vertical channel holes CH may be formed to penetrate the mold structure MS. Vertical channel structures VS may be formed to fill the vertical channel holes CH. The formation of the vertical channel structures VS may include forming first to eighth vertical channel structures VS1 to VS8 that are arranged in a zigzag fashion along the second direction D2.

The vertical channel structures VS may be formed on the first region R1. Although not shown, when the vertical channel structures VS are formed, dummy vertical channel structures DVS may be simultaneously formed to fill the vertical channel holes CH formed on the second region R2.

The formation of the vertical channel structures VS may include forming a data storage pattern DSP that conformally covers an inner sidewall of each of the vertical channel holes CH, forming a vertical semiconductor pattern VSP that covers the data storage pattern DSP, forming a buried dielectric pattern VI that fills a space surrounded by the vertical semiconductor pattern VSP, and forming a conductive pad PAD on the buried dielectric pattern VI.

Before the formation of the vertical channel holes CH, a trimming process may be performed on the mold structure MS. The trimming process may include forming a mask pattern that partially covers a top surface of the mold structure MS on the first region R1 and the second region R2, using the mask pattern to pattern the mold structure MS, reducing an area of the mask pattern, and patterning the mold structure MS by using the mask pattern whose area is reduced. The reducing the area of the mask pattern and the using the reduced mask pattern to pattern the mold structure MS may be performed alternately and repeatedly. The trimming process may allow the mold structure MS to have a stepwise structure on the second region R2. After the trimming process, a second dielectric layer (see 210 of FIG. 7A) may be formed to cover the stepwise structure of the mold structure MS on the second region R2.

Figure 17A:
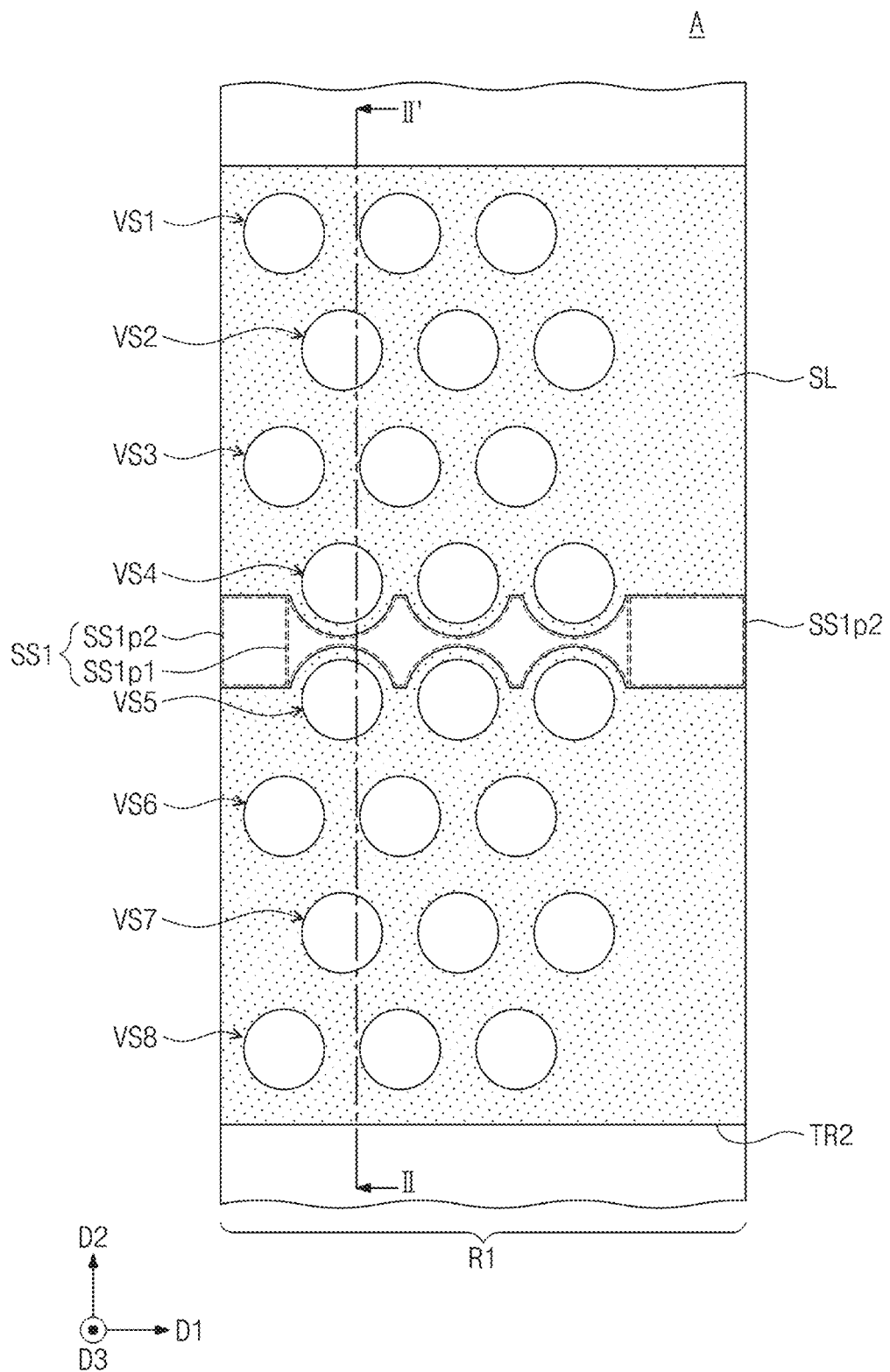
Figure 17B:
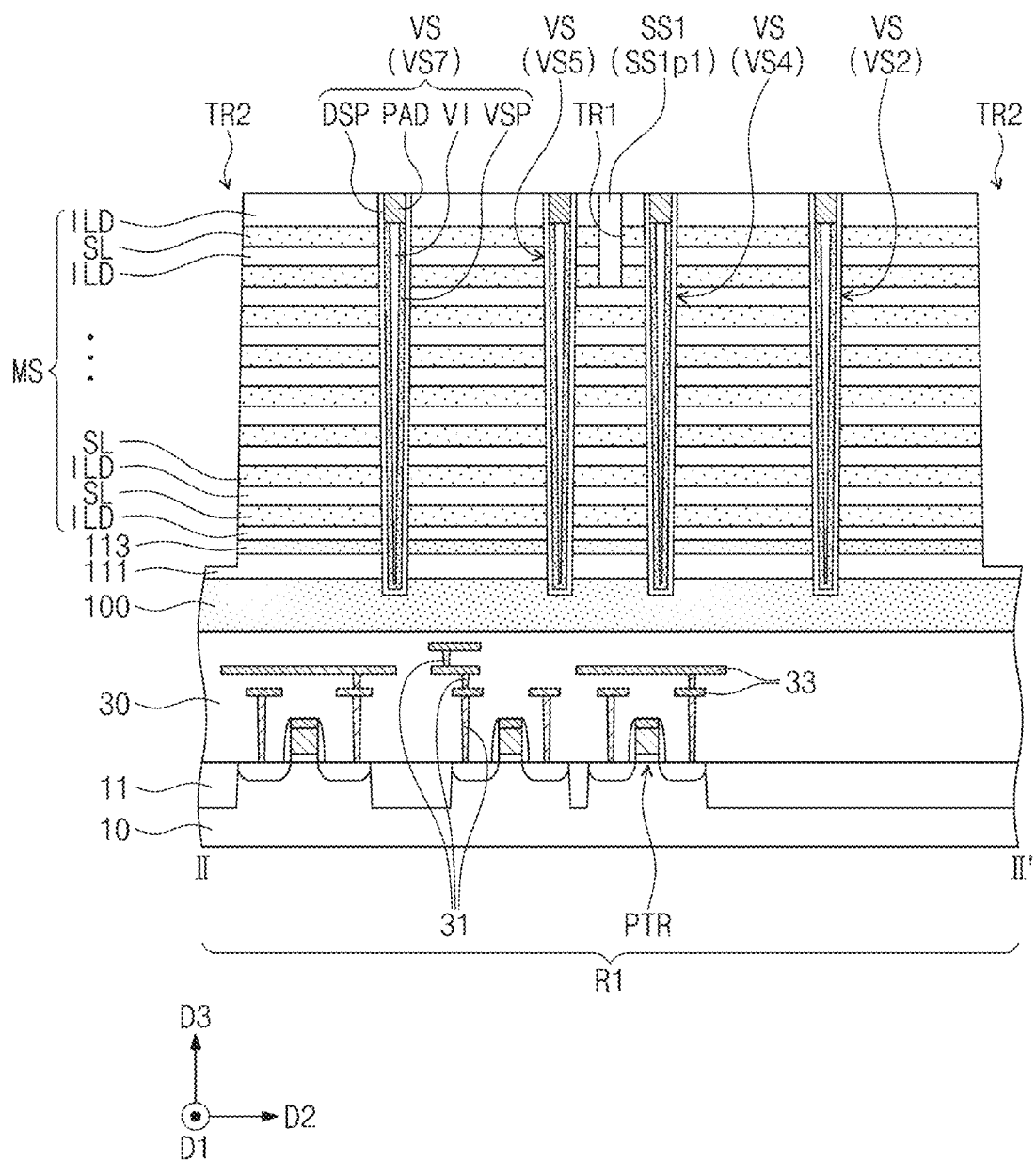
Figure 18A:
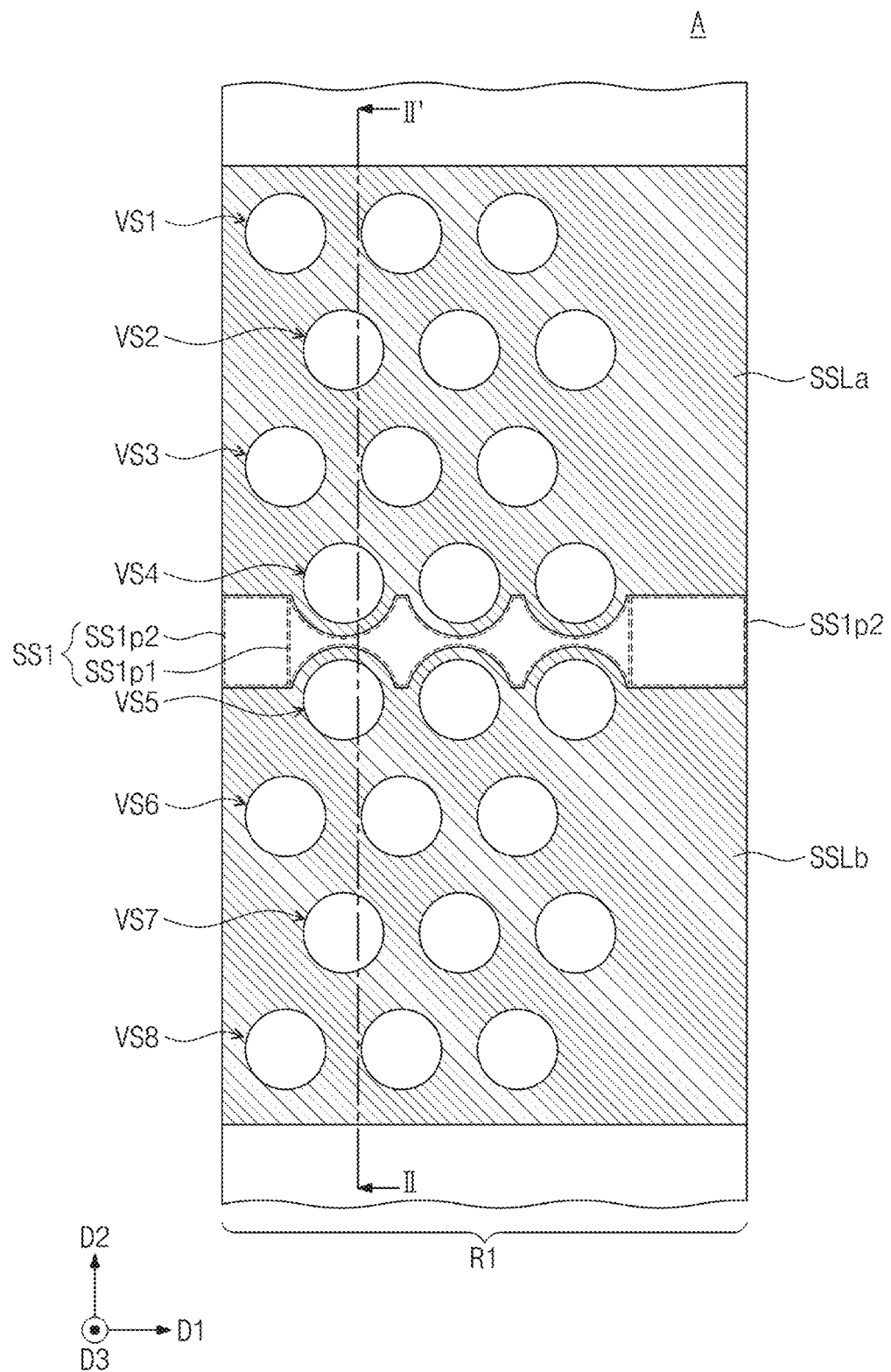
Figure 18B:
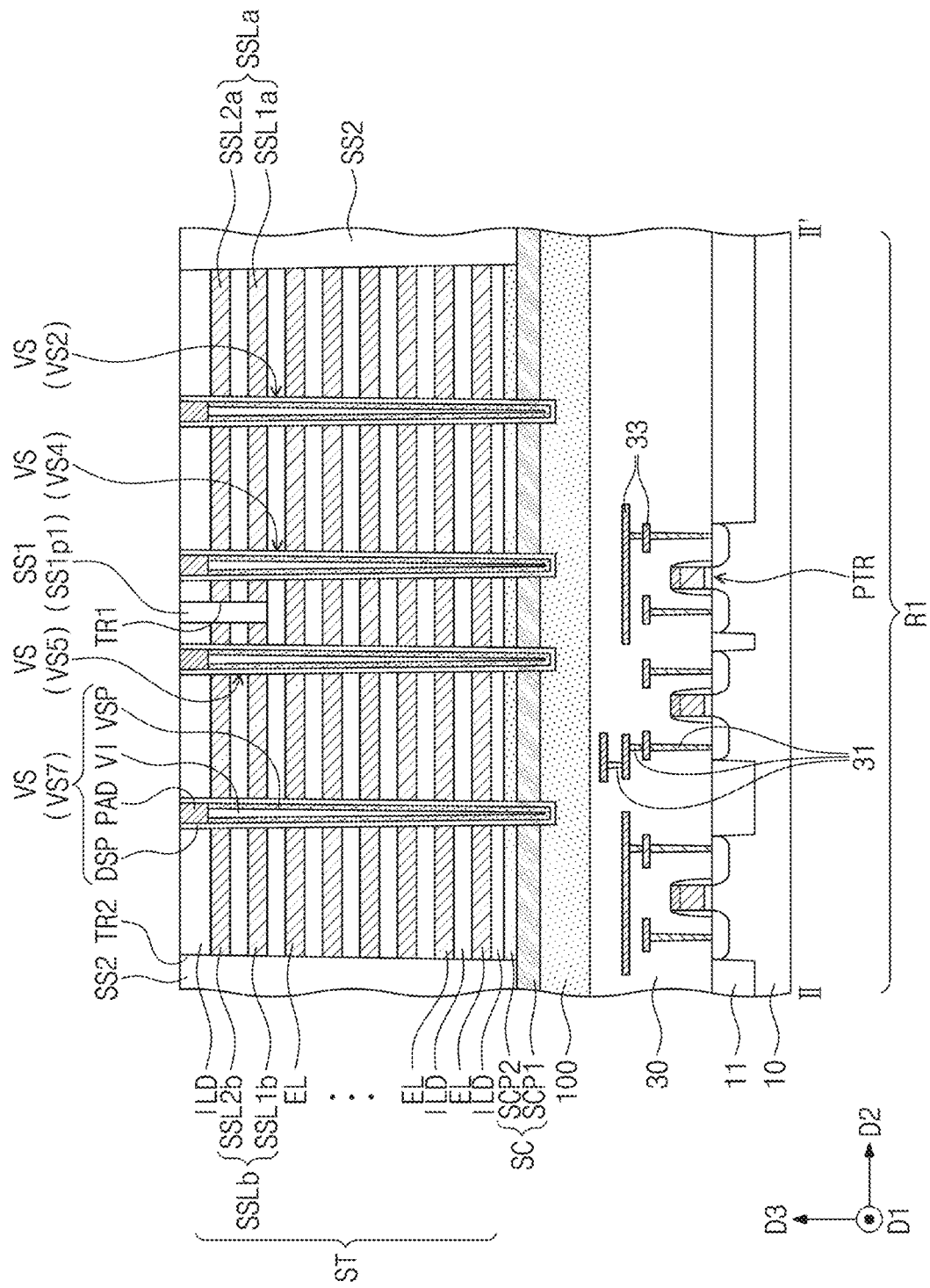

Referring to FIGS. 17A and 17B, a second trench TR2 may be formed to run in the second trench TR2 across the mold structure MS. The second trench TR2 may penetrate the mold structure MS. The second trench TR2 may further penetrate the lower semiconductor layer 113 and at least a portion of the lower sacrificial layer 111. The second trench TR2 may have a bottom surface located at a level lower than that of a bottom surface of the mold structure MS (or that of a bottom surface of a lowermost one among the interlayer dielectric layers ILD). The second trench TR2 may externally expose a portion of the lower sacrificial layer 111.

Referring to FIGS. 17A, 17B, 18A, and 18B, a selective removal may be performed on the lower sacrificial layer 111 and the sacrificial layers SL exposed by the second trench TR2. The selective removal of the lower sacrificial layer 111 and the sacrificial layers SL may be performed by a wet etching process that uses an etchant. Afterwards, a first source conductive pattern SCP1 may be formed to fill a space from which the lower sacrificial layer 111 is removed. In addition, gate electrodes EL and first and second string selection electrodes SSLa and SSLb may be formed to fill spaces from which the sacrificial layers SL are removed. In this step, the lower semiconductor layer 113 may be referred to as a second source conductive pattern SCP2. As a result, there may be formed a stack structure ST including a source structure SC that includes the first and second source conductive patterns SCP1 and SCP2 on the second substrate 100 and also including the interlayer dielectric layers ILD, the gate electrodes EL, and the first and second string selection electrodes SSLa and SSLb that are alternately stacked on the source structure SC.

Thereafter, a second separation structure SS2 may be formed to fill the second trench TR2. The second separation structure SS2 may be formed of, for example, silicon oxide.

Referring back to FIGS. 6, 7A, and 7B, a third dielectric layer 230 may be formed to cover the stack structure ST and the second dielectric layer 210. The third dielectric layer 230 may cover top surface of the vertical channel structures VS and top surfaces of the first and second separation structures SS1 and SS2.

On the first region R1, bit-line contact plugs BP may be formed to penetrate the third dielectric layer 230 and to electrically connect with the vertical channel structures VS. On the second region R2, cell contact plugs CP may be formed to penetrate the third dielectric layer 230 and at least a portion of the stack structure ST and to electrically connect with the gate electrodes EL and the first and second string selection electrodes SSLa and SSLb. One or ones of the cell contact plugs CP may penetrate the second dielectric layer 210.

On the first region R1, bit lines BL may be formed to electrically connect with the bit-line contact plugs BP. On the second region R2, conductive lines CL may be formed to electrically connect with the cell contact plugs CP. A fourth dielectric layer 250 may be formed on the third dielectric layer 230, covering the bit lines BL and the conductive lines CL. Although not shown, additional lines and additional vias may be formed in (or on) the fourth dielectric layer 250 which are electrically connected to the bit lines BL and the conductive lines CL.

According to some example embodiments of the present inventive concepts, vertical channel structures whose shapes and properties are similar due to analogous circumstances (or vertical channel structures with likelihood of degradation in electrical characteristics) may be connected in common to one of bit lines, and thus it may thus be possible to reduce possibility of degradation in cell characteristics and as a result to improve reliability and electrical characteristics of three-dimensional semiconductor memory devices.

Various controllers and functional blocks shown in the figures and described above may be implemented in processing circuitry such as hardware including logic circuits or a hardware/software combination such as a processor executing software. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although the present inventive concepts have been described in connection with some example embodiments of the present inventive concepts illustrated in the accompanying drawings, it will be understood by one of ordinary skill in the art that variations in form and detail may be made therein without departing from the spirit and essential feature of the present inventive concepts. The above disclosed example embodiments should thus be considered illustrative and not restrictive.

What is claimed is:

1. A three-dimensional semiconductor memory device, comprising:
   a substrate;
   a stack structure including a plurality of gate electrodes stacked in a vertical direction on the substrate and a plurality of string selection electrodes spaced apart from each other in a horizontal direction on the gate electrodes;
   a first separation structure running in a first direction across the stack structure and being between the string selection electrodes, the first separation structure including an insulating material;
   a plurality of vertical channel structures penetrating the stack structure; and
   a plurality of bit lines having connection with the vertical channel structures and extending in a second direction intersecting the first direction,
   wherein a first subset of the vertical channel structures is connected in common to one of the bit lines, the vertical channel structures of the first subset being adjacent to each other in the second direction across the first separation structure,
   wherein each of the string selection electrodes surrounds each of the vertical channel structures of the first subset, and
   wherein the first separation structure comprises
      a first part adjacent to a pair of the vertical channel structures that are adjacent to the first separation structure in the second direction, the first part having a first width in the second direction, the first part having the first width increasing and decreasing in the first direction, both sides of the first part in the second direction having contours inward corresponding to the pair of the vertical channel structures, respectively, each of the contours defining a space in which a portion of a corresponding one of the pair of vertical channel structures is accommodated, and
      a second part connected to the first part and having a second width in the second direction, the second width being uniform in the second direction, the first width being equal to or less than the second width in the second direction.

2. The device of claim 1, wherein the first part of the first separation structure is in contact with the string selection electrodes.

3. The device of claim 1, wherein the first width in the second direction of the first part repeatedly increases and decreases in the first direction.

4. The device of claim 1, wherein
   the stack structure comprises a plurality of stack structures,
   the device further comprises a second separation structure between the stack structures, the second separation structure extending in the first direction,
   a first top surface of each of the vertical channel structures adjacent to the first separation structure and on a cell array region of the substrate has a first diameter,
   a second top surface of each of the vertical channel structures adjacent to the second separation structure and on the cell array region of the substrate has a second diameter, and
   the first diameter is less than the second diameter.

5. The device of claim 4, wherein
   the second separation structure comprises a plurality of second separation structures, and
   a second subset of the vertical channel structures is connected in common to one of the bit lines, each of the vertical channel structures of the second subset being adjacent to a corresponding one of the second separation structures.

6. The device of claim 5, wherein
   each of the second separation structures comprises a protruding part that protrudes toward the vertical channel structures, and
   each of the vertical channel structures of the second subset comprises a part that protrudes in a same direction in which the protruding part protrudes.

7. The device of claim 1, wherein the vertical channel structures are symmetrically arranged with respect to the first separation structure.

8. The device of claim 7, wherein a number of the vertical channel structures arranged along the second direction is an even number.

9. The device of claim 1, wherein
   the stack structure comprises a plurality of stack structures,
   the device further comprises a plurality of second separation structures between the stack structures, the second separation structures extending in the first direction,
   the vertical channel structures comprise first to eighth vertical channel structures that are sequentially provided along the second direction,
   the fourth and fifth vertical channel structures are adjacent to the first separation structure,
   the first and eighth vertical channel structures are adjacent to corresponding ones of the second separation structures, respectively,
   the first, third, sixth, and eighth vertical channel structures are aligned with each other in the second direction, and
   the second, fourth, fifth, and seventh vertical channel structures are aligned with each other in the second direction.

10. The device of claim 9, wherein
    the bit lines comprise first to fourth bit lines that are arranged along the first direction, and
    the fourth and fifth vertical channel structures adjacent to the first separation structure are connected in common to the fourth bit line.

11. The device of claim 10, wherein
    the first and sixth vertical channel structures are connected in common to the first bit line,
    the third and eighth vertical channel structures are connected in common to the second bit line, and
    the second and seventh vertical channel structures are connected in common to the third bit line.

12. The device of claim 10, wherein the first and eighth vertical channel structures adjacent to corresponding ones of the second separation structures, respectively, are connected in common to the first bit line.

13. The device of claim 1, wherein
    the stack structure comprises a plurality of stack structures,
    the device further comprises a second separation structure between the stack structures, the second separation structure extending in the first direction, and
    a first length in the first direction of the first separation structure is less than a second length in the first direction of the second separation structure.

14. A three-dimensional semiconductor memory device, comprising:
    a substrate;
    a stack structure including a plurality of gate electrodes stacked in a vertical direction on the substrate and a plurality of string selection electrodes spaced apart from each other in a horizontal direction on the gate electrodes;
    a source structure between the substrate and the stack structure;
    a first separation structure between the string selection electrodes and being in a first trench that runs in a first direction across the stack structure;
    a second separation structure in a second trench on a lateral surface of the stack structure, the second separation structure extending in the first direction;
    a plurality of vertical channel structures in a plurality of vertical channel holes that penetrate the stack structure, the vertical channel structures being arranged in a zigzag fashion along a second direction intersecting the first direction;
    a plurality of bit lines connected to the vertical channel structures, the bit lines extending in the second direction;
    a plurality of bit-line contact plugs connecting the bit lines to corresponding ones of the vertical channel structures, respectively;
    a dielectric layer covering the stack structure; and
    a plurality of cell contact plugs penetrating the dielectric layer and at least a portion of the stack structure and connected to either the gate electrodes or the string selection electrodes,
    wherein a subset of the vertical channel structures is connected in common to one of the bit lines, the vertical channel structures of the subset being adjacent in the second direction to each other across the first separation structure,
    wherein each of the vertical channel structures overlaps in the vertical direction with two of the bit lines,
    wherein the vertical channel structures comprise first and second vertical channel structures, which are aligned with each other in the second direction, are adjacent to the first separation structure, are at both sides of the first separation structure, respectively, and are connected in common to one of the bit lines, and
    wherein the first and second vertical channel structures are in direct contact with a sidewall of the first separation structure.

15. The device of claim 14, wherein
    each of the vertical channel structures comprises
      a data storage pattern conformally covering an inner sidewall of a corresponding one of the vertical channel holes,
      a vertical semiconductor pattern conformally covering an inner sidewall of the data storage pattern,
      a buried dielectric pattern surrounded by the vertical semiconductor pattern, and
      a conductive pad on the buried dielectric pattern, and
    the data storage pattern comprises a plurality of dielectric layers extending in the vertical direction between the stack structure and the vertical semiconductor pattern.

16. The device of claim 14, wherein
    the vertical channel structures comprise first to eighth vertical channel structures that are sequentially arranged along the second direction,
    the first, third, sixth, and eighth vertical channel structures are aligned with each other in the second direction,
    the second, fourth, fifth, and seventh vertical channel structures are aligned with each other in the second direction, and
    the fourth and fifth vertical channel structures adjacent to the first separation structure are connected in common to one of the bit lines.

17. The device of claim 16, wherein a top surface of each of the fourth and fifth vertical channel structures has a semicircular shape or an arch shape.

18. An electronic system, comprising:
- a three-dimensional semiconductor memory device including a first substrate, a peripheral circuit structure on the first substrate, a cell array structure on the peripheral circuit structure, a dielectric layer covering the cell array structure, and an input/output pad on the dielectric layer and electrically connected to the peripheral circuit structure; and
- a controller configured to have electrical connection through the input/output pad with the three-dimensional semiconductor memory device and to control the three-dimensional semiconductor memory device, wherein the cell array structure comprises
- a second substrate on the peripheral circuit structure,
- a stack structure including a plurality of gate electrodes stacked in a vertical direction on the second substrate and a plurality of string selection electrodes spaced apart from each other in a horizontal direction on the gate electrodes,
- a first separation structure running in a first direction across the stack structure and being between the string selection electrodes, the first separation structure including an insulating material,
- a plurality of vertical channel structures penetrating the stack structure, and
- a plurality of bit lines connected to the vertical channel structures and extending in a second direction intersecting the first direction, wherein a first subset of the vertical channel structures is connected in common to one of the bit lines, the vertical channel structures of the first subset being adjacent in the second direction to each other across the first separation structure, wherein each of the string selection electrodes surrounds each of the vertical channel structures of the first subset, and wherein the first separation structure includes
- a first part adjacent to a pair of the vertical channel structures that are adjacent to the first separation structure in the second direction, the first part having a first width in the second direction, the first part having the first width increasing and decreasing in the first direction, both sides of the first part in the second direction having contours inward corresponding to the pair of the vertical channel structures, respectively, each of the contours defining a space in which a portion of a corresponding one of the pair of vertical channel structures is accommodated, and
- a second part connected to the first part and having a second width in the second direction, the second width being uniform in the second direction, the first width being equal to or less than the second width in the second direction.

* * * * *